United States Patent
Yasukawa

(10) Patent No.: US 9,276,586 B2
(45) Date of Patent: Mar. 1, 2016

(54) SEMICONDUCTOR DEVICE AND CLOCK CORRECTION METHOD

(71) Applicant: Renesas Electronics Corporation, Kawasaki-shi (JP)

(72) Inventor: Tomoki Yasukawa, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 29 days.

(21) Appl. No.: 14/061,605

(22) Filed: Oct. 23, 2013

(65) Prior Publication Data

US 2014/0118076 A1    May 1, 2014

(30) Foreign Application Priority Data

Nov. 1, 2012    (JP) .................. 2012-241624

(51) Int. Cl.
*H03L 7/00*    (2006.01)
*H03K 5/135*    (2006.01)

(52) U.S. Cl.
CPC . *H03L 7/00* (2013.01); *H03K 5/135* (2013.01)

(58) Field of Classification Search
CPC .................................. H03L 7/00; H03K 5/135
USPC ...................................... 331/2, 34, 46, 47, 49
See application file for complete search history.

(56) References Cited

U.S. PATENT DOCUMENTS

| | | | | |
|---|---|---|---|---|
| 5,475,324 A | * | 12/1995 | Tomiyori ..................... | 327/145 |
| 7,519,140 B2 | * | 4/2009 | Yoshimura ..................... | 375/376 |
| 7,884,656 B2 | * | 2/2011 | Lin ................................ | 327/156 |
| 7,890,787 B2 | * | 2/2011 | Bradley et al. ................ | 713/500 |
| 8,552,804 B1 | * | 10/2013 | Ren et al. ......................... | 331/2 |

FOREIGN PATENT DOCUMENTS

| | | |
|---|---|---|
| JP | 2000-315121 A | 11/2000 |
| JP | 2009-222486 A | 10/2009 |

* cited by examiner

*Primary Examiner* — Jeffrey Shin
(74) *Attorney, Agent, or Firm* — McGinn IP Law Group, PLLC

(57) ABSTRACT

A frequency error calculator circuit calculates the frequency error in a basic clock based on the basic clock and on a reference clock having a frequency higher than the basic clock. An operation clock generator circuit outputs an operation clock whose error has been corrected based on the frequency error calculated by the frequency error calculator circuit. An ON/OFF control circuit outputs an ON/OFF control signal that specifies the calculation timing that the frequency error calculator circuit calculates the frequency error of the basic clock based on the frequency error calculated by the frequency error calculator circuit.

20 Claims, 26 Drawing Sheets

FIG. 5

| FREQUENCY ERROR | VALUE CONVERTED IN REGISTER (d) OF FF114 | CORRECTION VALUE (NEGATIVE VALUE IS TWO'S COMPLEMENT FORMAT) |
|---|---|---|
| ... | ... | ... |
| -100ppm | 1FFF98 H | 1FFFA8 H |
| ... | ... | ... |
| -31.4ppm | 1FFFDF H | 1FFFFF H |
| -30.5ppm | 1FFFE0 H | 000000 H |
| -29.6ppm | 1FFFE1 H | 000001 H |
| ... | ... | ... |
| -1.91ppm | 1FFFFE H | 00001E H |
| -0.95ppm | 1FFFFF H | 00001F H |
| 0ppm | 000000 H | 000020 H |
| 0.95ppm | 000001 H | 000021 H |
| 1.91ppm | 000002 H | 000022 H |
| ... | ... | ... |
| 100ppm | 000068 H | 000088 H |
| ... | ... | ... |

FIG. 9

| BASIC CLOCK (a) FREQUENCY | COUNT VALUE (j) |
|---|---|
| 32.768kHz + 0.10ppm | 19999998 |
| 32.768kHz + 0.05ppm | 19999999 |
| 32.768kHz | 20000000 |
| 32.768kHz − 0.05ppm | 20000001 |
| 32.768kHz − 0.10ppm | 20000002 |

FIG. 11

| FREQUENCY ERROR | COUNT VALUE (j) | BIT VALUE (k) |
|---|---|---|
| +5ppm ~ | -19999900 | 000 |
| -5ppm ~ +5ppm | 19999900 - 20000100 | 001 |
| -15ppm ~ -5ppm | 20000100 - 20000300 | 010 |
| -25ppm ~ -15ppm | 20000300 - 20000500 | 011 |
| -35ppm ~ -25ppm | 20000500 - 20000700 | 100 |
| --- | --- | --- |

FIG. 12

| FREQUENCY ERROR | BIT VALUE (k) | ON-OFF INTERVAL |
|---|---|---|
| +5ppm ~ | 000 | 20 SECONDS |
| -5ppm ~ +5ppm | 001 | 15 SECONDS |
| -15ppm ~ -5ppm | 010 | 10 SECONDS |
| -25ppm ~ -15ppm | 011 | 5 SECONDS |
| -35ppm ~ -25ppm | 100 | 2 SECONDS |
| --- | --- | --- |

FIG. 18

| PRE-ERROR STORAGE CIRCUIT | COUNT VALUE (j) | BIT VALUE (l) | ON-OFF INTERVAL |
|---|---|---|---|
| 20000000 | 19999900 TO 20000100 | 000 | 20 SECONDS |
| | OTHER THAN ABOVE AND 19999800 TO 20000200 | 001 | 10 SECONDS |
| | OTHER THAN ABOVE | 010 | 1 SECOND |
| 20001000 | 20000900 TO 20001100 | 000 | 20 SECONDS |
| | OTHER THAN ABOVE AND 20000800 TO 20001200 | 001 | 10 SECONDS |
| | OTHER THAN ABOVE | 010 | 1 SECOND |

FIG. 23

| EXPECTATION VALUE STORAGE CIRCUIT | FREQUENCY ERROR | BIT VALUE (k) |
|---|---|---|
| TO 19999900 | FROM +5 ppm | 000 |
| 19999900 TO 20000100 | −5ppm TO +5ppm | 001 |
| 10000100 TO 20000300 | −15ppm TO −5ppm | 010 |
| 20000300 TO 20000500 | −25ppm TO −15ppm | 011 |
| 20000500 TO 20000700 | −35ppm TO −25ppm | 100 |
| 20000700 TO 20000900 | −45ppm TO −35ppm | 101 |
| 20000900 TO 20001100 | −55ppm TO −45ppm | 110 |

FIG. 24

| PRE-ERROR STORAGE CIRCUIT | COUNT VALUE (j) | BIT VALUE (l) |
|---|---|---|
| 20000000 | 19999900 TO 20000100 | 000 |
| 20000000 | OTHER THAN ABOVE AND 19999800 TO 20000200 | 001 |
| 20000000 | OTHER THAN ABOVE | 010 |
| 20001000 | 20000900 TO 20001100 | 000 |
| 20001000 | OTHER THAN ABOVE AND 20000800 TO 20001200 | 001 |
| 20001000 | OTHER THAN ABOVE | 010 |

FIG. 25

| COUNT VALUE (j) | ASSUMED TEMPERATURE | PRE-ERROR STORAGE CIRCUIT | BIT VALUE (k) | BIT VALUE (l) | TEMPERATURE FLUCTUATION | ON-OFF INTERVAL |
|---|---|---|---|---|---|---|
| 20000000 (0ppm) | VICINITY OF 25 DEGREES | 20000000 | 000 | 000 | NONE | 20 SECONDS |
| | | 20000020 | 000 | 001 | NO LARGE FLUCTUATION | 15 SECONDS |
| | | 20000500 | 000 | 010 | FLUCTUATION | 1 SECOND |
| 20001000 (-50ppm) | VICINITY OF -12 DEGREES OR VICINITY OF 62 DEGREES | 20001000 | 110 | 000 | NONE | 2 SECONDS |
| | | 20001020 | 110 | 001 | NO LARGE FLUCTUATION | 2 SECONDS |
| | | 20001500 | 110 | 010 | NONE | 1 SECOND |

SEMICONDUCTOR DEVICE AND CLOCK CORRECTION METHOD

CROSS-REFERENCE TO RELATED APPLICATIONS

The disclosure of Japanese Patent Application No. 2012-241624 filed on Nov. 1, 2012 including the specification, drawings and abstract is incorporated herein by reference in its entirety.

BACKGROUND

The present invention relates to a semiconductor device and to a clock correction method.

Many information devices contain a crystal oscillator (mainly a tuning fork crystal oscillator). The tuning fork crystal oscillator has an oscillator frequency for example of 32.768 kHz. Frequency dividing the 32.768 kHz frequency by $2^{15}$ gives a frequency of 1 Hz. The output clock for the oscillator circuit containing the tuning fork crystal oscillator is therefore utilized as an operation clock called the RTC (Real Time Clock or Real Time Counter).

The RTC just as the name implies, is a circuit for counting the time. Once operation has started the RTC therefore continues operating until the supply of electrical power is cut off. To continuously perform this type of operation the RTC must operate at low-power consumption.

However, this tuning fork crystal oscillator having a frequency of 32.768 kHz generally has temperature characteristics exhibiting a negative quadratic curve. More specifically, this tuning fork crystal oscillator has negative quadratic characteristics that peak at the normal temperature (around 25 degrees). This tuning fork crystal oscillator has a frequency deviation of approximately −100 ppm (parts per million) in the temperature vicinity of −40 degrees and 90 degrees. For example at a frequency deviation of −100 ppm, this error is equivalent to a daily error of 8.64 seconds which is not satisfactory in terms of clock precision. So in order to attain a high-precision of oscillator frequency (typically approximately ±10 ppm), the output clock (pulse) that is output from the oscillator circuit with the internal tuning fork crystal oscillator must be corrected.

Japanese Unexamined Patent Application Publication No. 2000-315121 discloses an RTC circuit having a simple structure that performs time correction. The RTC circuit contains an oscillator to oscillate at a basic clock (frequency for example of 32.768 kHz), and generate a frequency-divided signal from sub-dividing the basic clock. At the same time, a reference clock ] having a higher speed and higher precision than the basic clock is utilized to calculate the frequency error of the basic clock output from the oscillator. The oscillator having this correction function within the RTC utilizes the frequency-divided signal as a clock and adds a fixed value to the frequency error to output the cumulative value's MSB (most significant bit) as the correction clock. The frequency error is cumulatively summed during generation of the correction clock and the frequency error is corrected by changing the clock state at the time when the cumulative value was reflected to the above described MSB.

Japanese Unexamined Patent Application Publication No. 2009-222486 discloses a clock device for performing time correction at low-power consumption. This clock device performs error correction of the crystal oscillator by utilizing a clock signal output from a crystal oscillator to measure the time differential (frequency error) between the reference 1PPS signal output from the GPS receiver, and the 1PPS signal generated based on the signal output from the crystal oscillator. However, the correction accuracy of this clock device is unsatisfactory since the error is calculated and corrected based on the clock signal output from the crystal oscillator for correction.

SUMMARY

Attaining a high-precision (generally of approximately ±10 ppm) oscillator frequency as already described requires correcting the output clock from the oscillator circuit with internal tuning fork crystal oscillator. An RTC utilizing a tuning fork crystal oscillator on the other hand requires operation at low power consumption.

During correction of the oscillator frequency, the extent of frequency error in the pre-corrected clock must be calculated. However there are more circuits operating during calculation of the frequency error. These operating circuits increase the current consumption and also increase the electrical power consumption. On the other hand, not calculating the frequency error utilized for correcting the oscillator frequency over a long time period lowers the current consumption but also causes lower correction precision. So in other words there is a tradeoff relation between correction precision and electrical power consumption.

The description of the RTC circuit disclosed in Japanese Unexamined Patent Application Publication No. 2000-315121 (paragraph 0033 in Japanese Unexamined Patent Application Publication No. 2000-315121) assumes that there is a fixed correction interval (period for calculating the frequency error). Due to this fixed interval, the problem occurs of either larger electrical power consumption or lower correction precision when the temperature fluctuation has occurred.

Namely, the disclosed technology has the problem that the clock signal cannot be corrected with good precision while avoiding an increase in power consumption.

Other issues and novel features are hereafter clarified in the description in the present specifications and the accompanying drawings.

The semiconductor device according to an aspect of the invention utilizes the frequency error in the first clock to generate a correction clock, and also set the timing to recalculate the frequency error of the first clock according to the frequency error of the first clock.

The semiconductor device of the embodiment (the aspect of the invention) is capable of generating a high precision correction clock with minimal electrical power consumption.

BRIEF DESCRIPTION OF THE DRAWINGS

FIG. 5 is a drawing showing the relation between the correction value and the frequency error of the basic clock (a) of the first embodiment;

FIG. 9 is a table showing the relation between the frequency error of the basic clock (a) and the count value (j) of the first embodiment;

FIG. 11 is a table showing the data retained by the expectation value storage circuit of the first embodiment;

FIG. 12 is a table showing the data retained by the control signal generator circuit of the first embodiment;

FIG. 18 is a drawing showing an example of the interval for the bit value (l) and the ON-OFF control signal (h) attaining a high level in the second embodiment;

FIG. 23 is a table showing the data retained by the expectation value storage circuit of the sixth embodiment;

FIG. 24 is a table showing the data for describing the relation between the count value (j) and the value stored in the pre-error storage circuit of the sixth embodiment;

FIG. 25 is a table showing the data retained by the control signal generator circuit of the sixth embodiment;

DETAILED DESCRIPTION

First Embodiment

Figure 1:
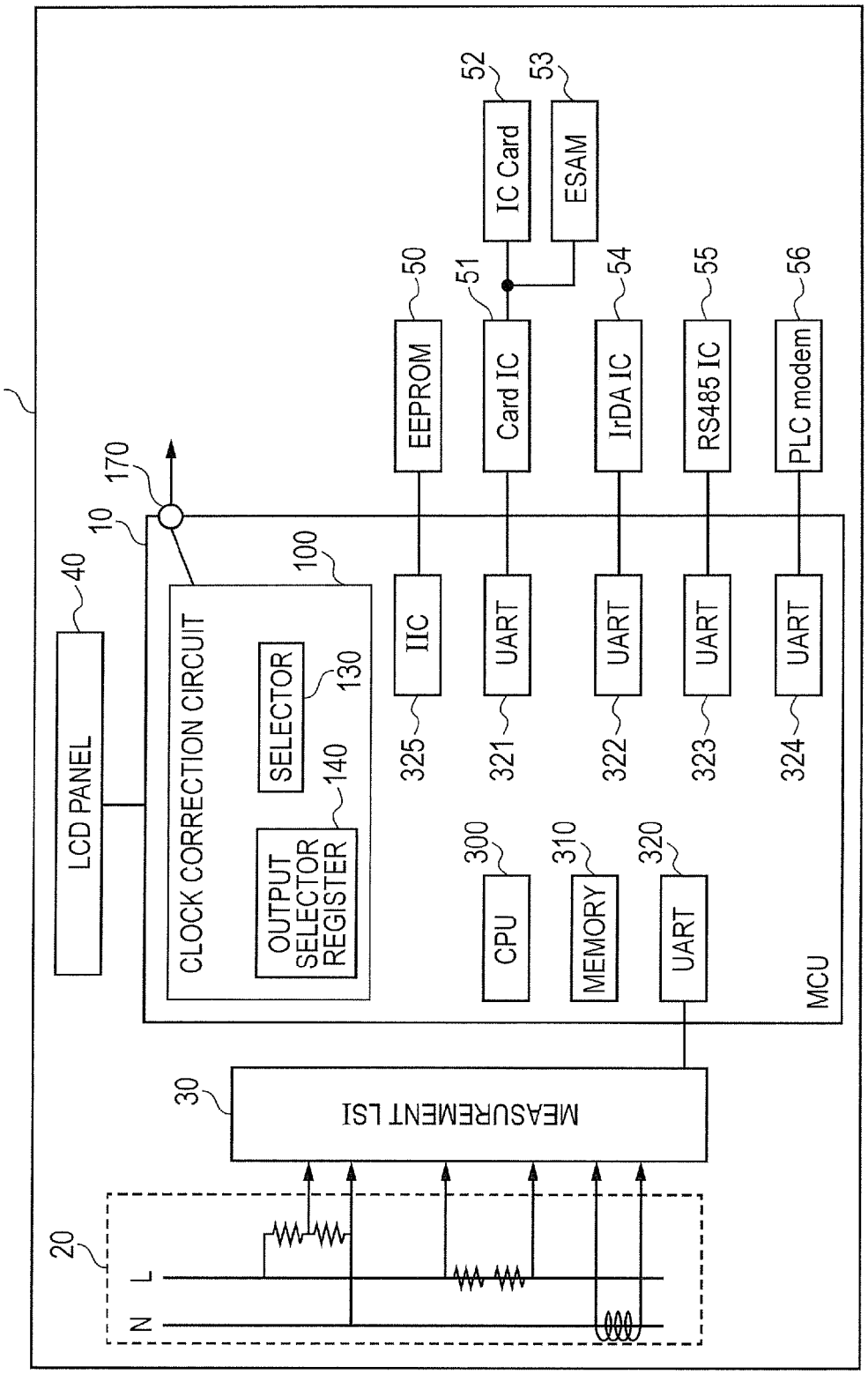
FIG. 1 is a block diagram showing the structure of the electronic equipment power meter device containing the MCU (semiconductor device) of the first embodiment.

The MCU (semiconductor device) of the present embodiment is hereafter described while referring as needed to the drawings. In the drawings, processing unit assigned the same reference numerals are essentially identical processing units and a related (redundant) description is omitted.

FIG. 1 is a block diagram showing the structure of the electric power meter device 1 as one example of the electronic equipment incorporating the MCU (semiconductor device) of the present embodiment.

<Structure of the Electric Power Meter Device 1>

The electric power meter device 1 includes an MCU (Micro Control Unit) 10, a measurement object unit 20, a measurement LSI (Large Scale Integration) 30, a LCD (Liquid Crystal Display) panel 40, an EEPROM50, and various types of external interfaces (Card IC51, IrDA IC54, RS485 IC55, PLC modem 56). The Card IC51 is an external interface capable of coupling to various types of card type devices (IC Card52, ESAM53).

The measurement object unit 20 internally includes electrical current detective sensors such as a shunt resistance and a CT (current sense transformer). The measurement LSI30 measures power the consumption in the measurement object unit 20 and notifies the MCU10 of the measurement results. The LCD panel 40 displays power rates etc. calculated by MCU10.

The external interfaces (Card IC51, IrDA IC54, RS485 IC55, PLC modem 56) are designed to allow coupling to the UART (Universal Asynchronous Receiver Transmitters) 321 through 324 within the MCU10 and to input and output the various types of information. The EEPROM (Electrically Erasable Programmable Read-Only Memory) 50 is a storage device coupling to the IIC325 within the MCU10. The EEPROM50 stores billing information internally.

The billing information as referred to here is information showing the relation between the billing sum for each time zone and the electrical power quantity. The billing information for example is information shown in a table format such as the billing sum per one kilowatt hour for the day time zone (6 a.m. to 8 p.m.); and the billing sum per one kilowatt hour for the night time zone (8 p.m. to 6 a.m.).

The MCU10 performs processing to calculate the billing sum from the electric power quantity calculated by the measurement LSI20. The MCU10 contains a clock correction circuit 100, CPU (Central Processing Unit) 300, memory 310, UART320 through UART324, and the IIC325.

The clock correction circuit 100 is a circuit that in this example is capable of functioning as the so-called RTC (Real Time Clock) and that couples to the external terminal 170 on the MCU10. While checking operation (during testing), the administrator for the electric power meter device 1 counts the frequency of the clock signal output from the external terminal 170 and tests if the required resolving power is provided or not. The clock correction circuit 100 supplies the counted time information to the CPU300 and elsewhere as needed. Detailed information on the internal structure and operation of the clock correction circuit 100 is described later on while referring to FIG. 3 and so on.

The CPU300 is a central processing unit that implements different types of control within the MCU10. The CPU300calculates the billing sum based on the billing information loaded from the EEPROM50, the time information supplied from the clock correction circuit 100, and information on the power consumption quantity supplied from the measurement LSI30. The CPU300 outputs the calculated billing sum to the appropriate external device (such as a printer) or the LCD panel 40.

The memory 310 is for example a ROM (Read Only Memory) or is a RAM (Random Access Memory) and stores various types of information. In the above description, the EEPROM50 stores the billing information however the memory 310 may also store the billing information. The UART320 through 324 couple to the measurement LSI30 or the external interfaces (Card IC51, etc.) and control the input/output of various types of information.

Though not shown in FIG. 1, the MCU10 includes a temperature sensor, an A/D converter, and a time oscillator, etc. A more detailed description is given later on while referring to FIG. 2, etc.

The MCU10 as shown in the figure includes an external terminal 170 that couples to the clock correction circuit 100. Though described later on in detail, the type of clock signal (operation clock (f), non-corrected basic clock (a)) is set in the output selector register 140's setting value. The selector 130 described later on, selects the output clock signal according to the setting value in the output selector register 140 and outputs the selected clock signal from the external terminal 170. The operation clock is a clock whose frequency error was corrected within the MCU10 as subsequently described, and has high-precision however the higher precision caused increased power consumption.

<Structure of the Clock Correction Circuit 100 and Peripheral Circuits>

Figure 2:
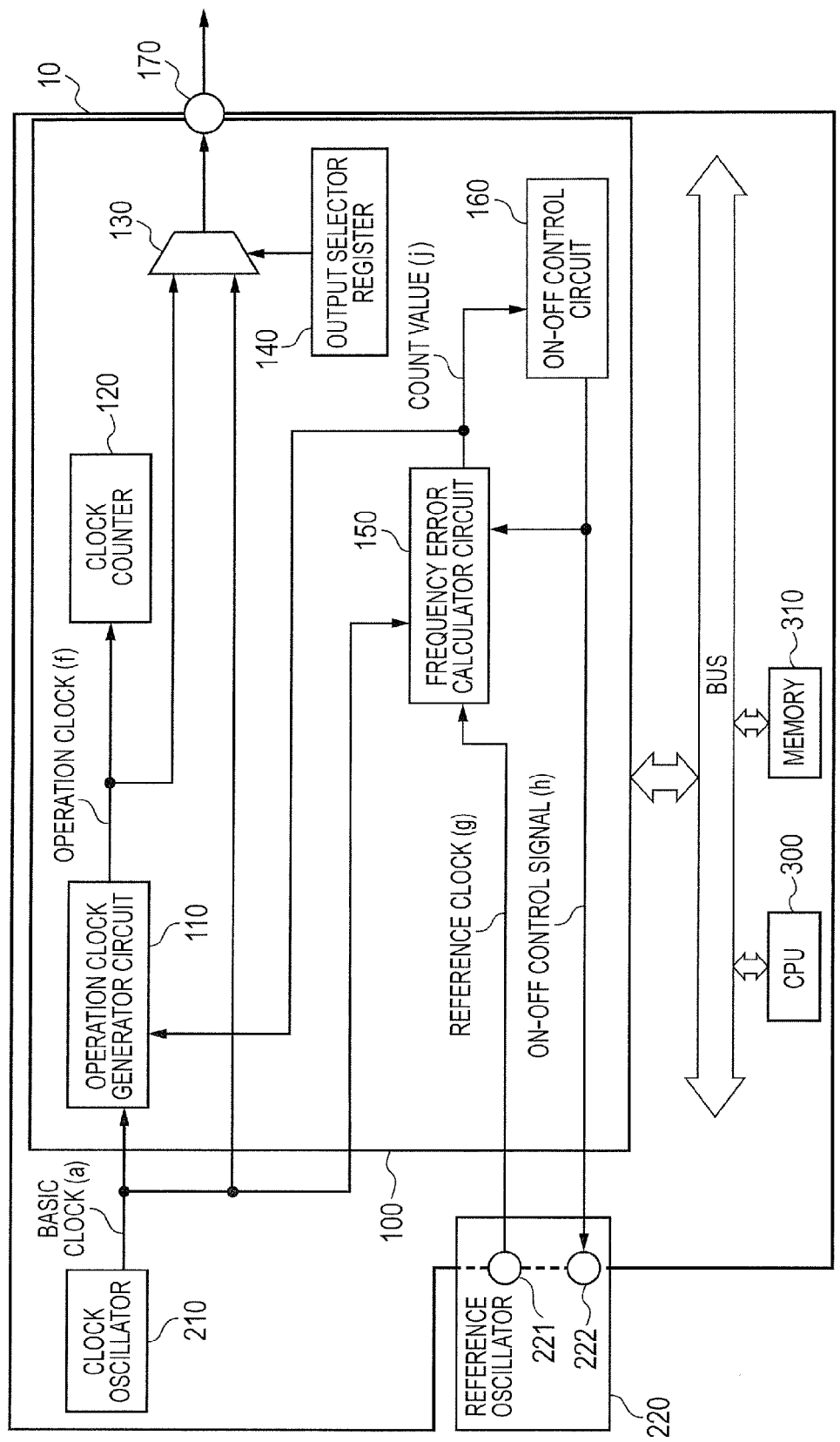
FIG. 2 is a block diagram showing the structure of the MCU (semiconductor device) of the first embodiment.

The overall structure of the clock correction circuit 100 is described while referring to FIG. 2. The clock correction circuit 100 includes an operation clock generator circuit 110 (correction clock generator circuit), clock counter 120, selector 130, output selector register 140, frequency error calculator circuit 150 (frequency error calculator unit), and ON-OFF control circuit 160 (control circuit). The selector 130 is coupled to the external terminal 170.

A basic clock (first clock) is supplied to the operation clock generator circuit 110 within the clock correction circuit 100 from the clock oscillator 210. The clock oscillator 210 is an oscillator for generating the basic clock (a). In the following description, the basic clock (a) frequency is 32.768 kHz. The basic clock (a) generated by the clock oscillator 210 in most cases has a frequency error to an extent not allowable by the electric power meter device 1. The clock oscillator 210 supplies the generated basic clock (a) to the operation clock generator circuit 110.

The reference oscillator 220 is an oscillator circuit for generating a high-speed clock signal (named reference clock (g) or the second clock in the following description) of approximately 1 to 20 MHz. The ON-OFF control circuit 160 described later on inputs a binary ON-OFF control signal to the reference oscillator 220. The reference oscillator 220 outputs a reference clock signal (g) to the frequency error calculator circuit 150, only in the case when input with a high-level (value indicating ON) ON-OFF control signal (h). A structural example of the reference oscillator 220 is described later on while referring to FIG. 13 and FIG. 14.

The operation clock generator circuit 110 loads a fixed value (described later on while referring to FIG. 5) from the register (storage unit) not shown in the drawing. The operation clock generator circuit 110 outputs an operation clock (f) whose frequency error in basic clock (a) was corrected according to the fixed value and the count value (j) that was input. The count value (j) is a value that can be converted into the frequency error of the basic clock (a). In the following description, the operation clock (f) is a one hertz clock signal whose frequency error in basic clock (a) was corrected based on the basic clock (a) (32.768 kHz). In the present embodiment, the frequency error calculator circuit 150 calculates a count value (j) convertible to a frequency error (ppm) of the basic clock (a). The operation clock generator circuit 110 supplies an operation clock (f) to the clock counter 120 and the selector 130. The structure of the operation clock generator circuit 110 is described in detail later on while referring to FIG. 3 through FIG. 7.

The clock counter 120 is a counter that measures real-world time by counting up the operation clocks (f) output from the operation clock generator circuit 110. The clock counter 120 internally includes for example counters that respectively count to 60 seconds, 60 minutes, and 24 hours (not shown in drawing). The clock counter 120 supplies the counted time information (seconds, minutes, hours) to the CPU300 and so on as needed.

The selector 130 selects the operation clock (f) or the basic clock (a) according to the values stored in the output selector register 140 and supplies the selected clock to the external terminal 160. The user of the electric power meter device 1 (for example the administrator of the electric power meter device 1) can rewrite the value of the output selector register 140 to an optional timing.

The ON-OFF control circuit 160 inputs an ON-OFF control signal (h) to the frequency error calculator circuit 150. When the ON-OFF control signal (h) is at high level (value indicating ON), the frequency error calculator circuit 150 utilizes the reference clock (g) output by the reference oscillator 220 to calculate the frequency error (count value (j)) of the basic clock (a). The frequency error calculator circuit 150 in other words calculates the frequency error (count value (j)) of the basic clock (a) at the timing indicated by the ON-OFF control signal (h). The frequency error calculator circuit 150 supplies the calculated frequency error (count value (j)) of the basic clock (a) to the operation clock generator circuit 110 and the ON-OFF control circuit 160. The frequency error calculator circuit 150 is described in detail later on while referring to FIG. 8.

The ON-OFF control circuit 160 generates an ON-OFF control signal (h) based on the frequency error (count value (j)) input from the frequency error calculator circuit 150. The ON-OFF control signal (h) is a binary signal that indicates whether or not to set the reference oscillator 220 and the frequency error calculator circuit 150 in an operating state as already described. In the present example, if the ON-OFF control signal is at high level then a value is set indicating operation. The ON-OFF control circuit 160 adjusts the interval until the ON-OFF control signal (h) next reaches high level, according to the size of the count value (j). The structure of the ON-OFF control circuit 160 is described in detail later on while referring to FIG. 10.

<Structure and Operation of the Operation Clock Generator Circuit 110>

Figure 3:
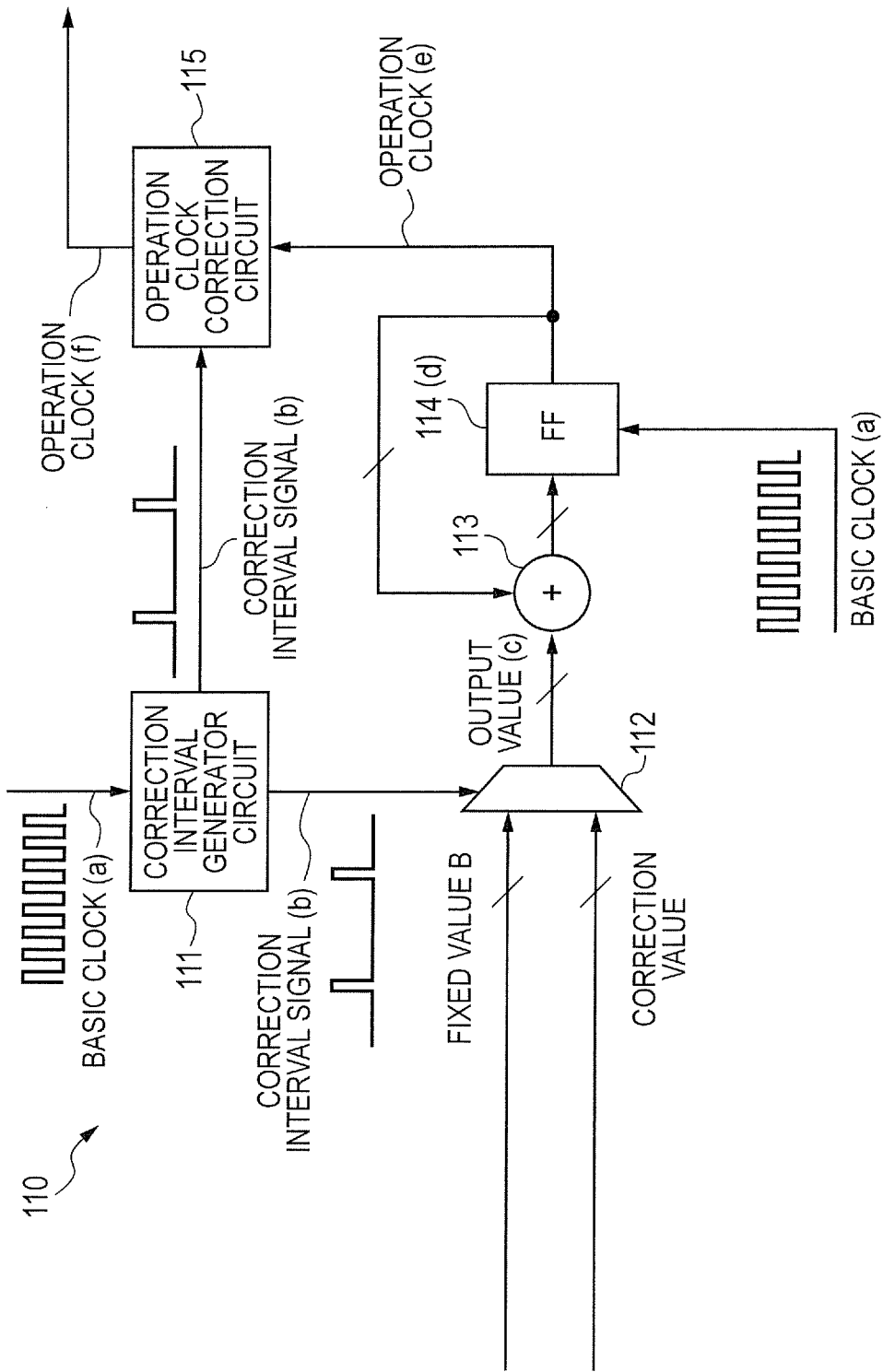
FIG. 3 is a block diagram showing the structure of the clock correction circuit of the first embodiment.

The structure of the operation clock generator circuit 110 is described next while referring to FIG. 3. The operation clock generator circuit 110 includes a correction interval generator circuit 111, a selector 112, an adder 113, a FF (flip-flop) 114, and an operation clock correction circuit 115. The operation clock generator circuit 110 generates a corrected clock corrected the frequency error based on the frequency error (count value (j) calculated by the frequency error calculator circuit 150.

The correction interval generator circuit 111 generates a correction interval signal (b) for reporting a fixed timing based on the basic clock (a) that is for example a one-shot pulse of 1 Hz (signal having a high level for just one clock, where 32767 clocks among the 32768 clocks are low-level clock pulses). The correction interval generator circuit 111 has an internal divider (2 to the $15^{th}$ power) and generates the above described correction interval signal (b) and supplies the generated signal (b) to the selector 112 and the operation clock correction circuit 115. The correction interval generator circuit 111 may be any structure that allows generating signals capable of reporting the fixed timing so that the frequency of the correction interval signal (b) is not limited to 1 Hz. In the following description, the frequency of the correction interval signal (b) is set to 1 Hz (one-shot pulse).

When the correction interval signal (b) is a high level, the selector 112 supplies the corrected value to the adder 113, and when a low level supplies a fixed value B to the adder 113. If there is no frequency error in the basic clock (a) the corrected value and the fixed value B are identical values. The method for setting the corrected value and the fixed value B is described later on along with the operation of the flip-flop 114.

The adder 113 sums the output value (c) of the selector 112 and the output value (register value (d)) of the flip-flop 114, and supplies the summed results to the data terminal of the flip-flop 114.

The flip-flop 114 operates the basic clock (a) as a clock terminal input. The flip-flop 114 contains n bit registers. In the following description, the value of the register retained by the flip-flop 114 is described as the register value (d). The basic clock (a) is 32.768 kHz so the flip-flop 114 loads the summed value of the register value (d) of flip-flop 114 and the output value (c) of selector 112 into the register value (d) 32768 times in a one second period. The flip-flop 114 then supplies the register value (d) to the operation clock correction circuit 115. More specifically, the flip-flop 114 supplies to the operation clock correction circuit 115 an operation clock (e) whose value changes at the switching timing that the upper second bit in the register value (d) switches.

Figure 4:
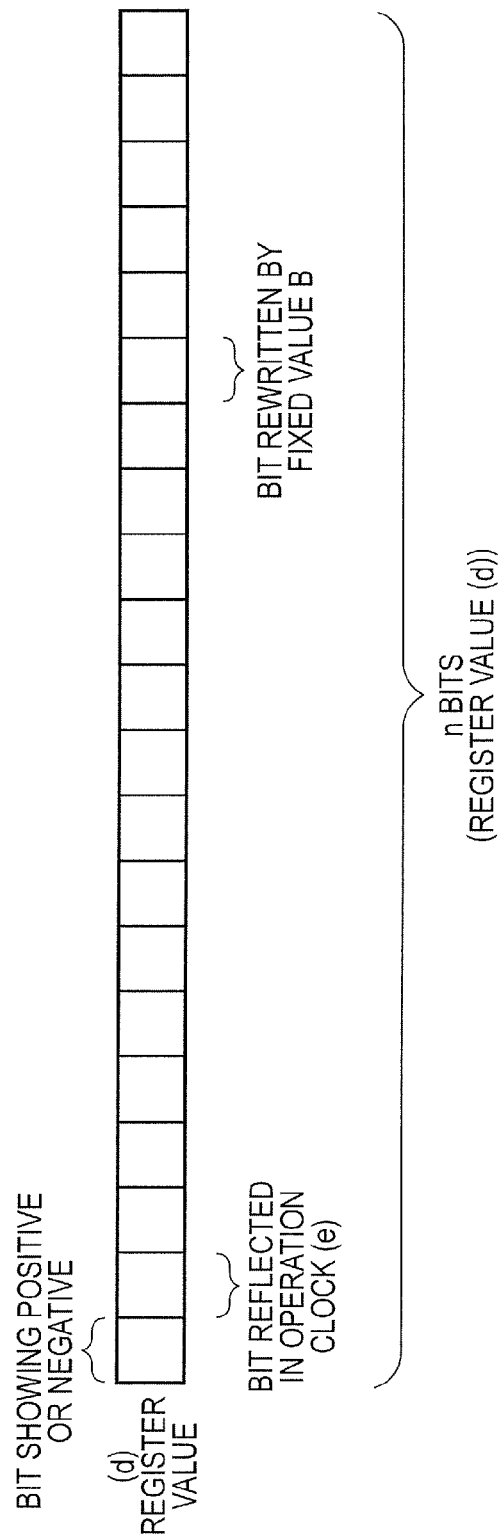
FIG. 4 is a drawing showing the structure of the register within the flip-flop of the first embodiment.

FIG. 4 is a drawing showing the structure of the register within the flip-flop 114. The register is rewritten 32768 times in a one second period. The uppermost bit in the flip-flop 114 is a bit indicating a positive-negative bit value. The upper second bit (specified bit) value is a value showing the state of the clock signal supplied to the operation clock correction circuit 115. The clock signal serves as the operation clock (operation clock (e) before correction by the operation clock correction circuit 115 described later). If there is no frequency error in the basic clock (a), the corrected value and the fixed value B are identical values, and the value within the register is incremented 32768 times ($2^{15}$). The register must therefore have a bit width of 16 bits (1 bit showing a positive value +15 bits ($2^{15}$)) or more. FIG. 4 shows a register having a bit width of 21 bits.

The fixed value B is set to the value that the upper second bit in the register value (d) changes to when added 32768 times. The fixed value B is in other words, established at a value according to the required frequency of the operation clock (e). A value where a 1 is set in the lower sixth bit (upper 16 (1+15) bit) serves as the fixed value B.

Assuming for example that the data width in the register was set to the above described 16 bits, the minimum unit (correction resolution) of the frequency error adjustable by the correction value is 30.5 ppm ($\frac{1}{2^{15}}$). If reducing the correction resolution is preferred, the register can be extended to the lower side than the bit rewritten by the fixed value B. The larger the bit width extension to the lower side, the narrower the frequency error expressed by the correction value becomes so that the correction resolution can be made smaller. If the width is extended by m bits, the correction resolution becomes ($\frac{1}{2^{15+m}}$). If m=5, the correction resolution becomes 0.95 ppm ($\frac{1}{2^{15+5}}$), which satisfies the 1 ppm required by the electrical power industry market. In the following description, M=5. In other words, the data width for register value (d) is set to 21 bits. The fixed value B is 000020H in hexadecimal notation.

The method for calculating the correction value from the frequency error of the basic clock (a) is described next. The count value (j) is convertible into ppm format (described later on) so the method for calculating the correction value after conversion to ppm format is described. The data width of the register value (d) is 21 bits (1 bit showing positive or negative +20 bits) and so the LSB (least significant bit) of the register value (d) corresponds to 0.95 ppm ($\frac{1}{2^{20}}$). A frequency error 0.95 ppm for example corresponds to 000001H (hexadecimal), and a frequency error −0.95 ppm corresponds to 1FFFFFH (hexadecimal) by utilizing two's complement formulas. Though described later on, the frequency error calculator circuit 150 inputs the frequency error into the operation clock generator circuit 110 in a format for the count value (j). The operation clock generator circuit 110 converts the count value (j) into a frequency error (ppm) and afterwards converts the frequency error into a correction value. Though not shown in the drawings, the processor unit for performing the conversion is within the operation clock generator circuit 110.

The correction value is added when the correction interval signal (b) has reached high level. Restated into other words, the fixed value B is not added when the correction interval signal (b) has reached high level. The correction value is therefore calculated by adding the fixed value B and a value where the frequency error of the basic clock (a) was converted to a value (error value) corresponding to the register value (d). More specifically, the correction value when the data width of register value (d) is 21 bits is calculated by utilizing the formula shown below in [Formula I]. The "$10^6$" in [Formula 1] is due to the ppm that is in millionths. If the frequency error for example is 0.95 ppm, the correction value is 000021H (hexadecimal). If the frequency error is −0.95 ppm, the correction value is 00001FH (hexadecimal). If the data width of the register value (d) is bits, then the relation between the frequency error of basic clock (a) and the correction value are shown in FIG. 5. In order to calculate the correction value by adding the fixed value B and error value, the adder 113 cumulatively adds the fixed value B 32768 times in a one second period, and performs processing identical to the processing to reflect (add or subtract) the error value just one time in the cumulatively added results.

$$\text{Correction value} = (\text{frequency error[ppm]} \times 2^{20}/10^6)_{hexadecimal} + 000020H \qquad \text{[Formula 1]}$$

Figure 6:
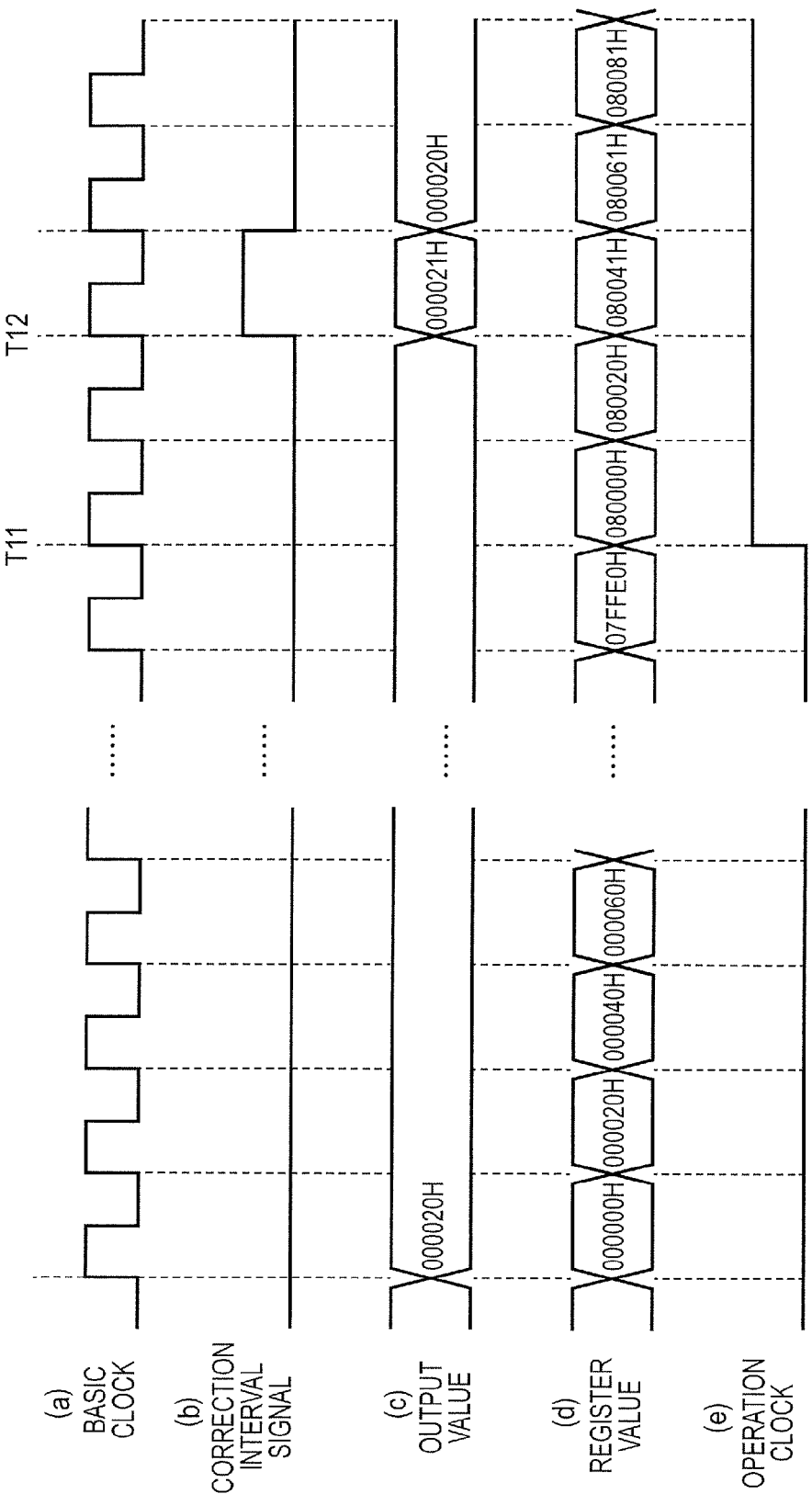
FIG. 6 is a timing chart showing the output signals for each circuit within the operation clock generator circuit of the first embodiment.

FIG. 6 is a timing chart showing the output signals for each circuit within the operation clock generator circuit 110. In order to clarify the description, the correction value in FIG. 6 is permanently set to 000021H.

Switching of the value in basic clock (a) occurs 32768 times in a one second period. The correction interval signal (b) reaches high level in just one cycle of the basic clock (a) at a ratio of one to every 32768 times (timing T12). The selector value (c) of the selector attains a correction value 000021H just in the period (timing T12) where the correction interval signal (b) reaches high level and at all other timings is 000020H as the fixed value B.

The register value (d) cumulatively adds the selector value (c) of the selector and changes the value in the operation clock (e) at a timing (timing T11) where the upper second bit value within the register is switched. The register value (d) in FIG. 6 is expressed in hexadecimal notation so that when the operation clock (e) switches to high level when the register value (d) shifts from 07xxxxH (x is optional) to 08xxxxH (x is optional), and switches to low level when the register value (d) shifts from 0FxxxxH (x is optional) to 0x0000H (x is optional).

Figure 7:
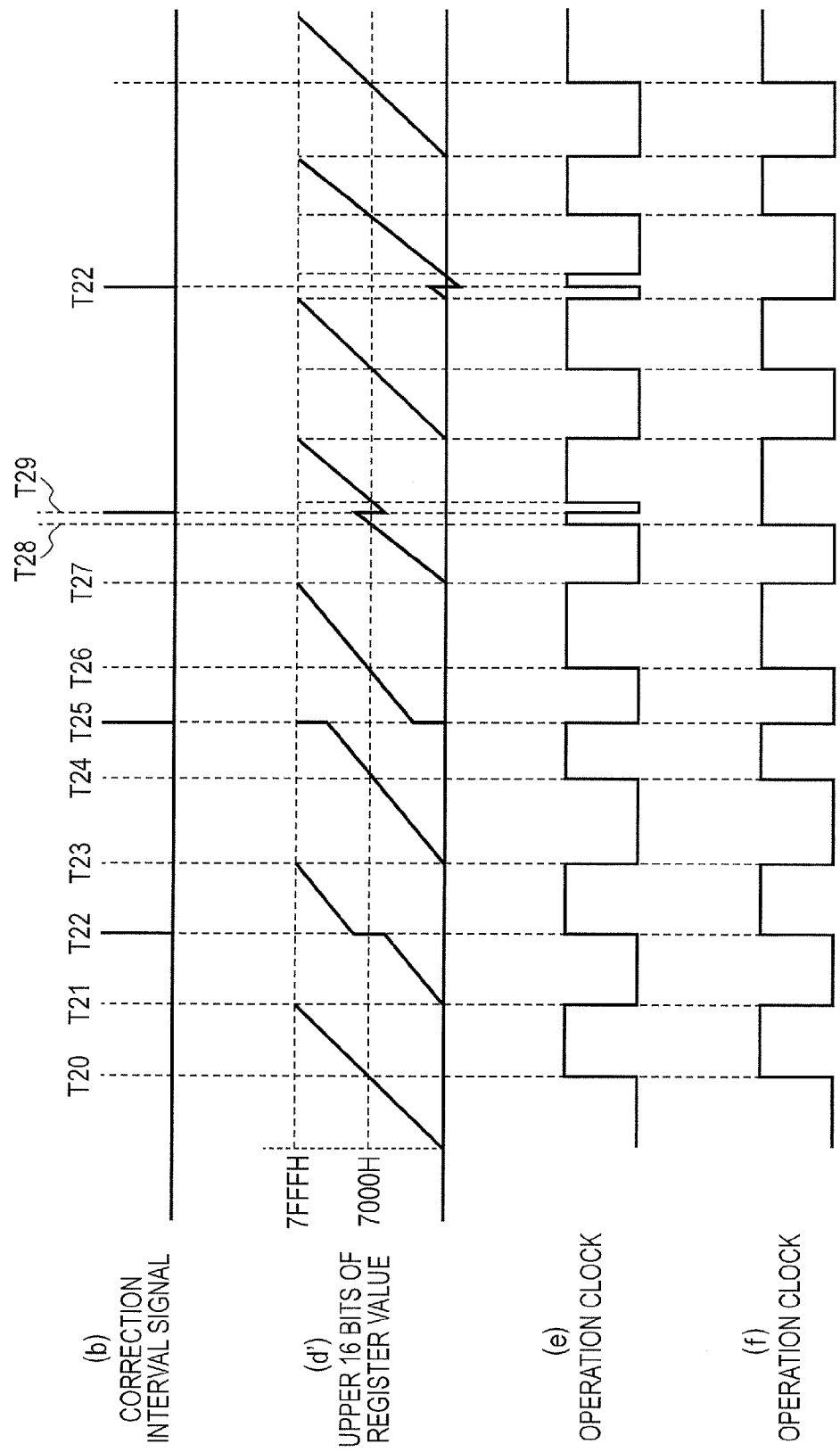
FIG. 7 is a timing chart showing the functioning of the operation clock correction circuit of the first embodiment.

The operation of the operation clock correction circuit 115 is described next while referring to FIG. 3 and FIG. 7. FIG. 7 is a timing chart showing the operation of the operation clock correction circuit 115.

The correction value as described above can be a positive number or also a negative number. Correction can therefore be implemented when the frequency error of the basic clock (a) is positive or the frequency error of the basic clock (a) is negative (and also implemented when the basic clock (a) is faster than the desired frequency or when slower than the desired frequency). The upper second bit in the register value (d) (namely the operation clock (e)) might sometimes change at a timing (timing T21, T22) where the correction interval signal (b) in FIG. 7 attains high level. This operation results unintentionally from an unnecessary increase in the frequency of the operation clock (e).

The operation clock correction circuit 115 is a circuit that prevents the above change. As shown in FIG. 3, the operation clock (e) and the correction interval signal (b) are input to the operation clock correction circuit 115.

The operation clock correction circuit 115 detects the change in value of the operation clock (e) at the timing T20 through T28. Within a specified time after that detection, the operation clock correction circuit 115 detects a re-change in value in the operation clock (e) at the timing where the correction interval signal (b) shifts at high level. Here, when the correctable minimum value was for example −100 ppm, this specified time is a four clock period (round-up value of 100 ppm/30.5 ppm) of operation clock (e), and a period where the re-change in the value of the operation clock (e) after it was already changed is wrong. The operation clock correction circuit 115 detects the re-change in the value of operation clock (e) for example at T29 within a specified time after T28. When the re-change in this value is detected, the operation clock correction circuit 115 generates an operation clock (f) that ignores the re-change (T29) in the value of operation clock (e). An operation clock (f) preventing an unintentional increase in the frequency of operation clock (e) can be generated in this way.

The operation clock correction circuit 115 may be any circuit capable of detecting the (pulse) edge of correction interval signal (b) and correcting the edge timing of the operation clock (e) after counting to a specified time, and may also be contrived from a combination of already utilized optional digital circuits. The operation clock correction circuit 115 supplies the generated operation clock (f) to the clock counter 120 and the selector 130.

<Frequency Error Calculator Circuit 150>

Figure 8:
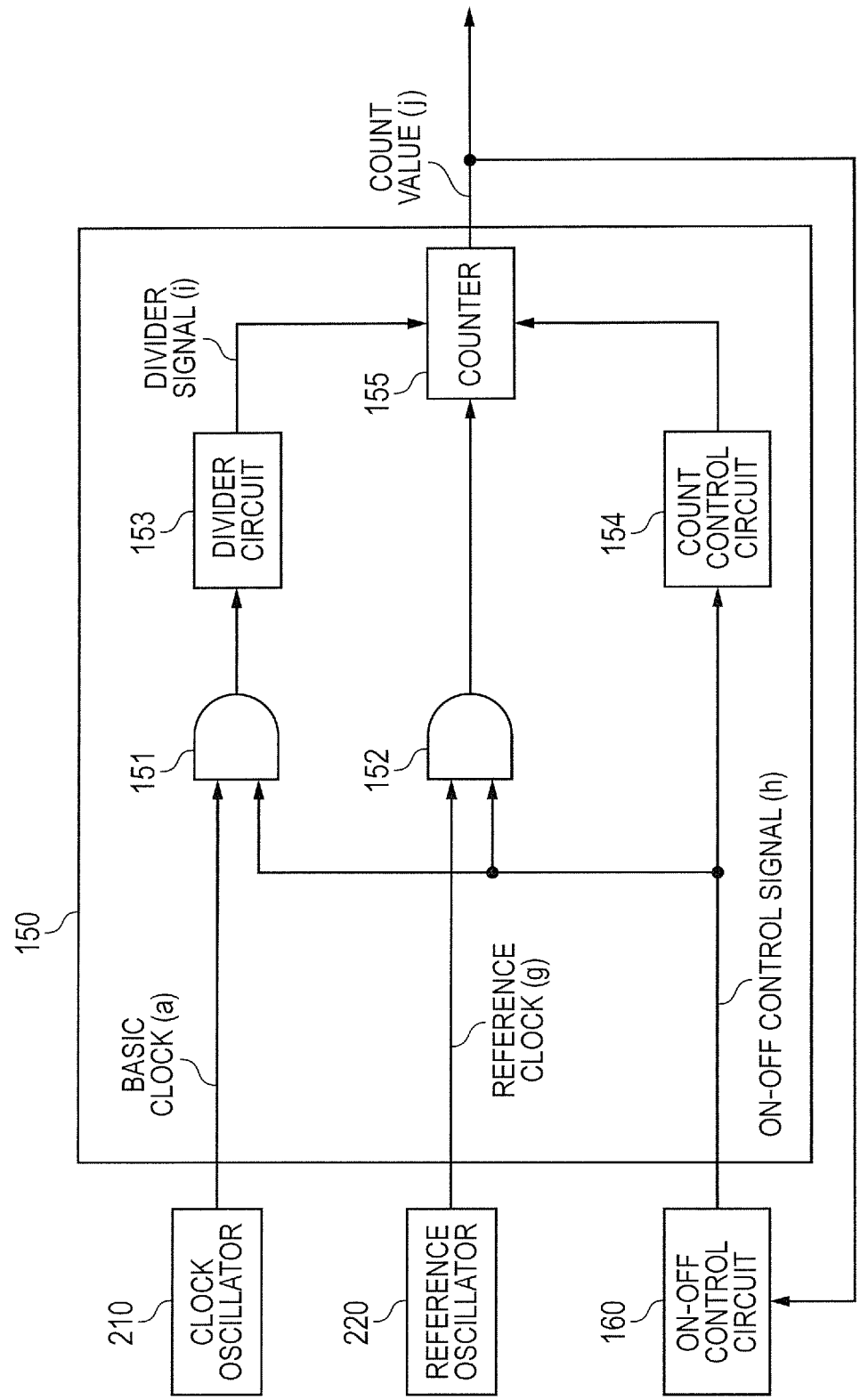
FIG. 8 is a block diagram showing the structure of the frequency error calculator circuit of the first embodiment.

FIG. 8 is a block diagram showing the structure of the frequency error calculator circuit 150. The frequency error calculator circuit 150 contains an AND circuit 151 (first AND circuit), an AND circuit 152 (second AND circuit), a divider circuit 153, a count control circuit 154, and a counter 155.

The ON-OFF control signal (h) and basic clock (a) are input to the AND circuit 151. The AND circuit 151 inputs the logical product value of both input signals to the divider circuit 153. Restated in other words, the AND circuit 151 utilizes the ON-OFF control signal (h) to mask the basic clock (a).

An ON-OFF control signal (h) and a reference signal (g) are input to the AND circuit 152. The AND circuit 152 inputs the logical product value of both input signals to the counter 155. Restated in other words, the AND circuit 152 utilizes the ON-OFF control signal (h) to mask the reference clock (g).

The divider circuit 153 generates a divider signal (i) that divides the input basic clock (a) and inputs the generated divider signal (i) to the counter 155. The divider circuit 153 generates for example a divider signal with frequency of approximately 1 to 128 Hertz by dividing a basic clock (a) of 32.768 kHz. In the following description, the divider signal (i) is set to 1 Hz and the reference clock (g) is set to 20 MHz.

The count control circuit 154 outputs a permit signal allowing processing of the count from the counter 155 when a high-level ON-OFF control signal (h) was input. Operation in the counter 155 utilizes the divider signal (i) as an operation trigger, and processes the count using the reference clock (g) as the operation clock. More specifically, the counter 155 counts the number of reference clock (g) inputs in the period between the rising edge (or falling edge) of the divider signal (i) and the next rising edge (or falling edge). The counter 155 may count the number of reference clock (g) inputs during the multiple cycles of divider signal (i), and calculates an average of the counts. The counter 155 inputs the count value (j) calculated in the count processing to the operation clock generator circuit 110 and the ON-OFF control circuit 160.

FIG. 9 is a table showing the relation between the count value (j) and basic clock (a) frequency error. As described above, the reference clock (g) is 20 MHz, and the divider signal (i) is 1 Hz. The frequency error is therefore 0 ppm when the count value (j) is 20000000, then frequency error increases as the deviation from the 20000000 becomes larger. The operation clock generator circuit 110 makes use of this corresponding relation to convert the count value (j) to the basic clock (a). The count value (j) can in this way be also seen as a value showing the frequency error of basic clock (a).

<Structure of ON-OFF Control Circuit 160>

Figure 10:
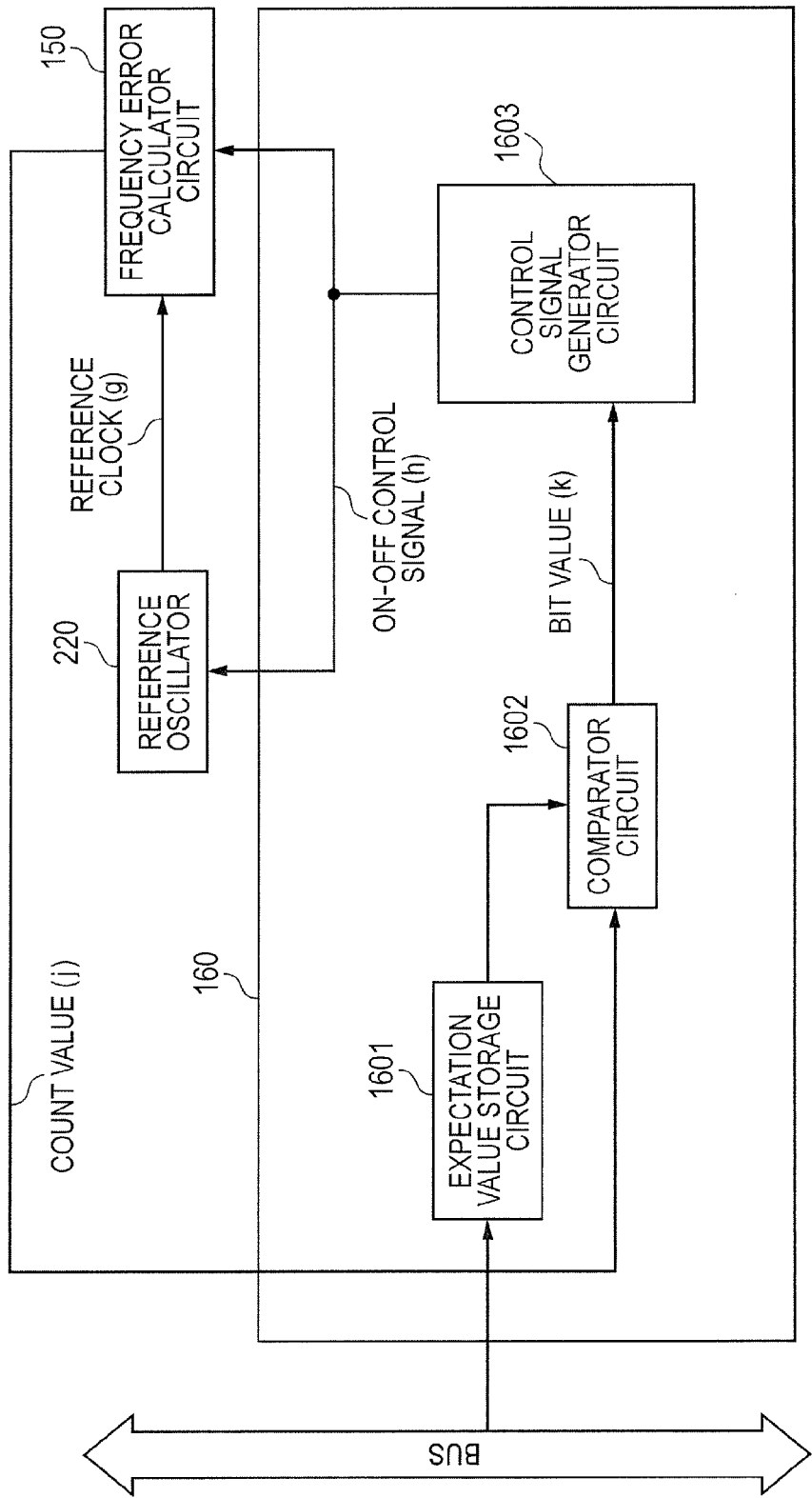
FIG. 10 is a block diagram showing the structure of the ON-OFF control circuit of the first embodiment.

FIG. 10 is a block diagram showing the structure of ON-OFF control circuit 160. The ON-OFF control circuit 160 contains an expectation value storage circuit 1601, a comparator circuit 1602 (first comparator circuit), and a control signal generator circuit 1603.

The expectation value storage circuit 1601 is a circuit that retains the relation between the count value (j) and output value (bit value (k)) of the comparator circuit 1602. Here, the expectation value of the count value (j) that should be output is 20000000. The expectation value storage circuit 1601 retains the relation (hereafter, also described as the expectation value information) between the deviation with this expectation value, and the output value (value converted at the timing that the ON-OFF control signal (h) transitions) corresponding to that deviation. FIG. 11 is a drawing showing examples of data retained by the expectation value storage circuit 1601. In FIG. 11, the frequency error (ppm) in basic clock (a) corresponding to the count value (j) is shown for facilitating the description.

The count value (j) output from the frequency error calculator circuit 150 is input to the comparator circuit 1602. The comparator circuit 1602 loads the expectation value information (FIG. 11) from the expectation value storage circuit 1601, and outputs the bit value (k) based on the expectation value information (FIG. 11) and count value (j) to the control signal generator circuit 1603. When the count value (j) for example is 20000400 the comparator circuit 1602 outputs 011 as the bit value (k) to the control signal generator circuit 1603.

The control signal generator circuit 1603 adjusts the timing for transitioning the ON-OFF control signal (h) to the high level (namely ON) according to the bit value (k). The control signal generator circuit 1603 internally retains the data shown for example in FIG. 12 and controls the timing that the ON-OFF control signal (h) reaches high level according to the bit value (k). When for example the bit value (k) is 010, the control signal generator circuit 1603 transitions the ON-OFF control signal (h) to the high level after 10 seconds from the timing of the previous high level and outputs that ON-OFF control signal (h).

As shown in FIG. 12, the smaller the frequency error of basic clock (a) (if the frequency error is a minus value, the absolute value becomes larger), the shorter the interval in which the ON-OFF control signal (h) transitions to high level. The reason is described while referring to FIG. 13.

Figure 13:
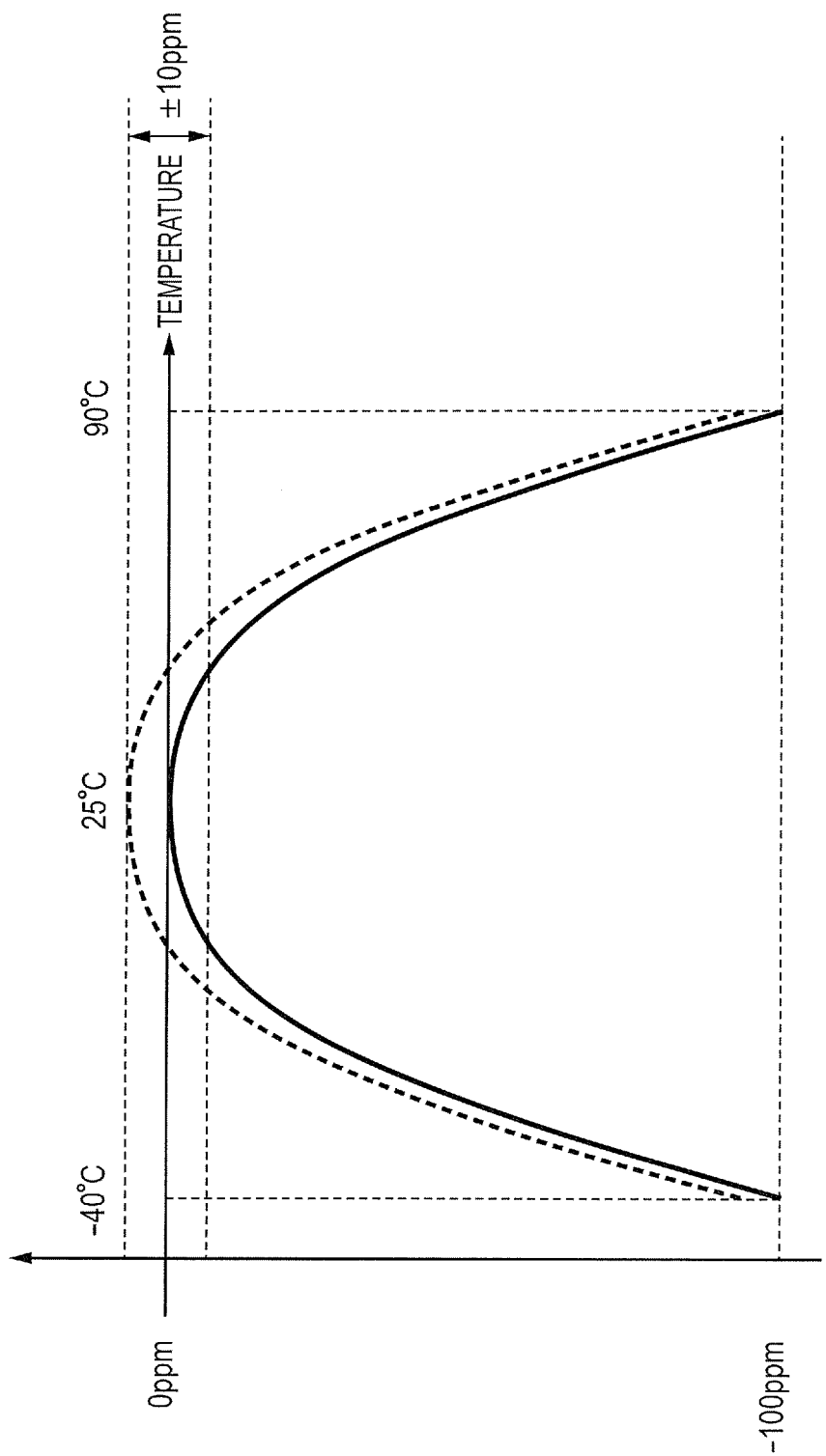
FIG. 13 is a graph showing the temperature characteristics of the tuning fork crystal oscillator.

FIG. 13 is a graph showing the temperature characteristics of the tuning fork crystal oscillator having a frequency of 323.768 kHz. In this graph, the normal temperature is described as approximately 25 degrees. The frequency error is approximately −100 ppm in the vicinity of a temperature of −40 degrees or 90 degrees. The frequency error is approximately 0 ppm in the vicinity of 25 degrees which is the normal temperature. As shown in the figure, in the vicinity of the normal temperature (frequency error is approximately 0 ppm), as the change in frequency error accompanying the temperature fluctuation becomes smaller, and the temperature differential relative to normal temperature becomes larger (as the frequency error moves away from 0 ppm), the amount of change in frequency error accompanying the temperature fluctuation becomes larger. In the vicinity of +25 degrees for example where the frequency error is approximately 0 ppm, the amount of change in frequency error relative to the temperature fluctuation is small. On the other hand in the vicinity of +90 degrees, the amount of change in frequency error relative to the temperature fluctuation is large.

The control signal generator circuit 1603 lengthens the interval at which the ON-OFF control signal (h) reaches high level when in the vicinity of the normal temperature (namely, the frequency error is small) even when there is some fluctuation in the temperature. However, when some distance away from the normal temperature (namely, the frequency error is large), the control signal generator circuit 1603 shortens the interval at which the ON-OFF control signal (h) reaches high level for large changes in frequency error due to a small temperature fluctuation, and frequently rewrites the frequency error value.

The temperature characteristics are a negative quadratic function so at a large frequency error in the plus direction (Here, +5 ppm as shown by the dotted line in FIG. 13.) the change in frequency error relative to the temperature fluctuation is small. Therefore the interval for the ON-OFF control signal (h) to transition to high level is large as show in FIG. 11 and FIG. 12.

(Structure of Reference Oscillator 220)

Figure 14:
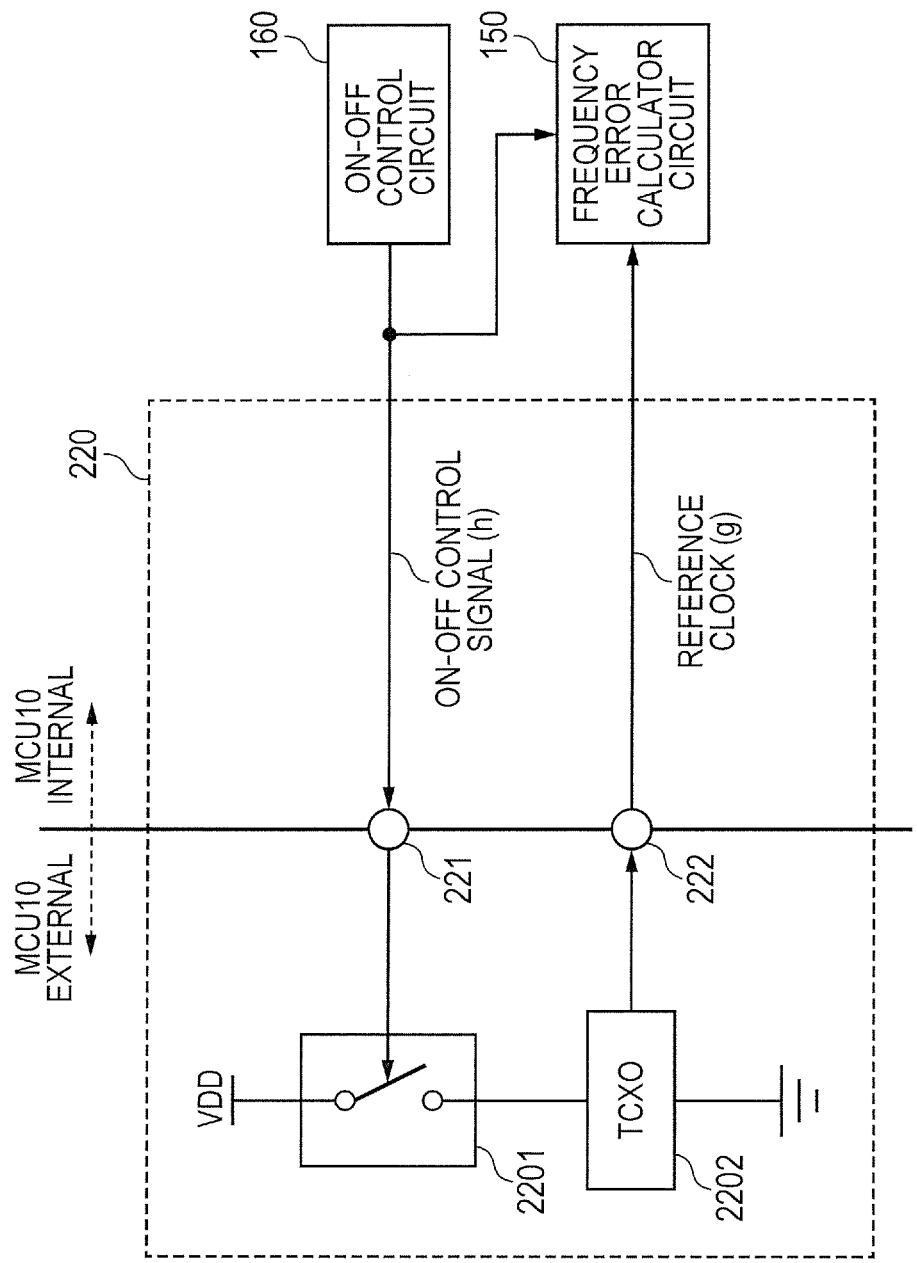
FIG. 14 is a block diagram showing an example of the structure of the reference oscillator of the first embodiment.

The reference oscillator 220 is structured extending inside and outside the MCU10 and couples to an external circuit via the external terminal 221 and external terminal 222. An example of the structure of the reference oscillator 220 is described while referring to the drawing. FIG. 14 is a block diagram showing an example of the reference oscillator 220.

The reference oscillator 220 contains an analog switch 2201 and TCXO 2202 outside the MCU10. The analog switch 2201 and TCXO (temperature controlled crystal oscillator) 2202 are respectively coupled to the MCU10 by way of the external terminals 221 and 222.

A power supply voltage VDD is supplied to one end of the analog switch 2201, and the TCXO2202 is coupled to the other end. The analog switch 2201 is in a closed state only when the ON-OFF control signal (h) is high level. The TCXO2202 is coupled to one end of the analog switch 2201, and also coupled to GND. The TCXO2202 is supplied with a power supply voltage VDD by way of the analog switch 2201 when the ON-OFF control signal (h) is high level, and during supply of the power supply voltage VDD, the TCXO 2202 supplies the reference clock (g) to the frequency error calculator circuit 150 by way of the terminal 222.

Figure 15:
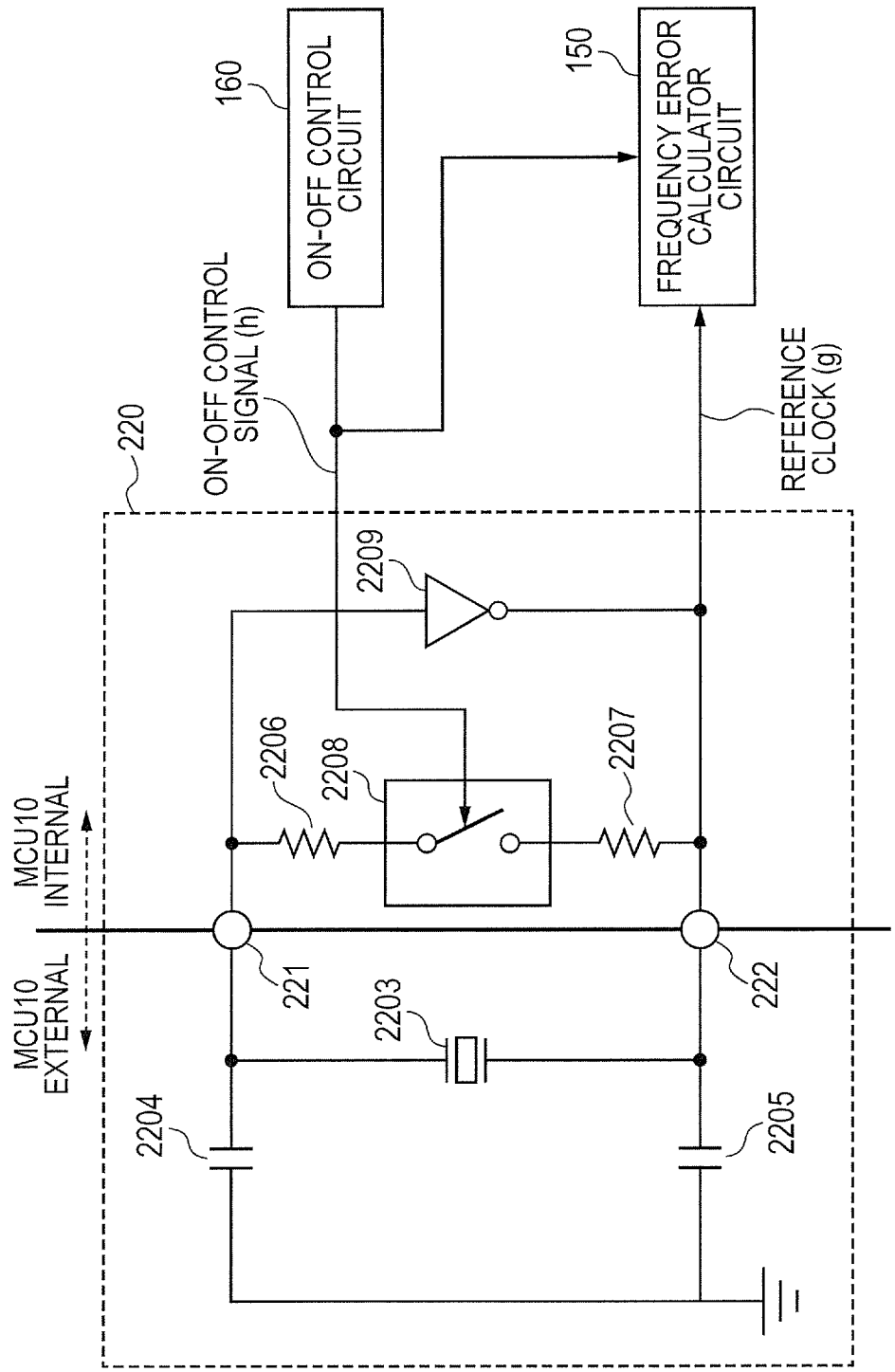
FIG. 15 is a block diagram showing an example of the structure of the reference oscillator of the first embodiment.

FIG. 15 is a block diagram showing a second example of the reference oscillator 220. The reference oscillator 220 contains a crystal oscillator 2203, a condenser 2204, and a condenser 2205 outside the MCU10, and contains a resistor 2206, resistor 2207, analog switch 2208, and an inverter 2209 inside the MCU10. The components are coupled in a relation just as shown in FIG. 15. An ON-OFF control signal (h) is supplied to the analog switch 2208. The analog switch 2208 is in a closed state only when the ON-OFF control signal (h) is at high level. The reference clock (g) is in this way only generated when the ON-OFF control signal (h) is at high level.

Figure 16:
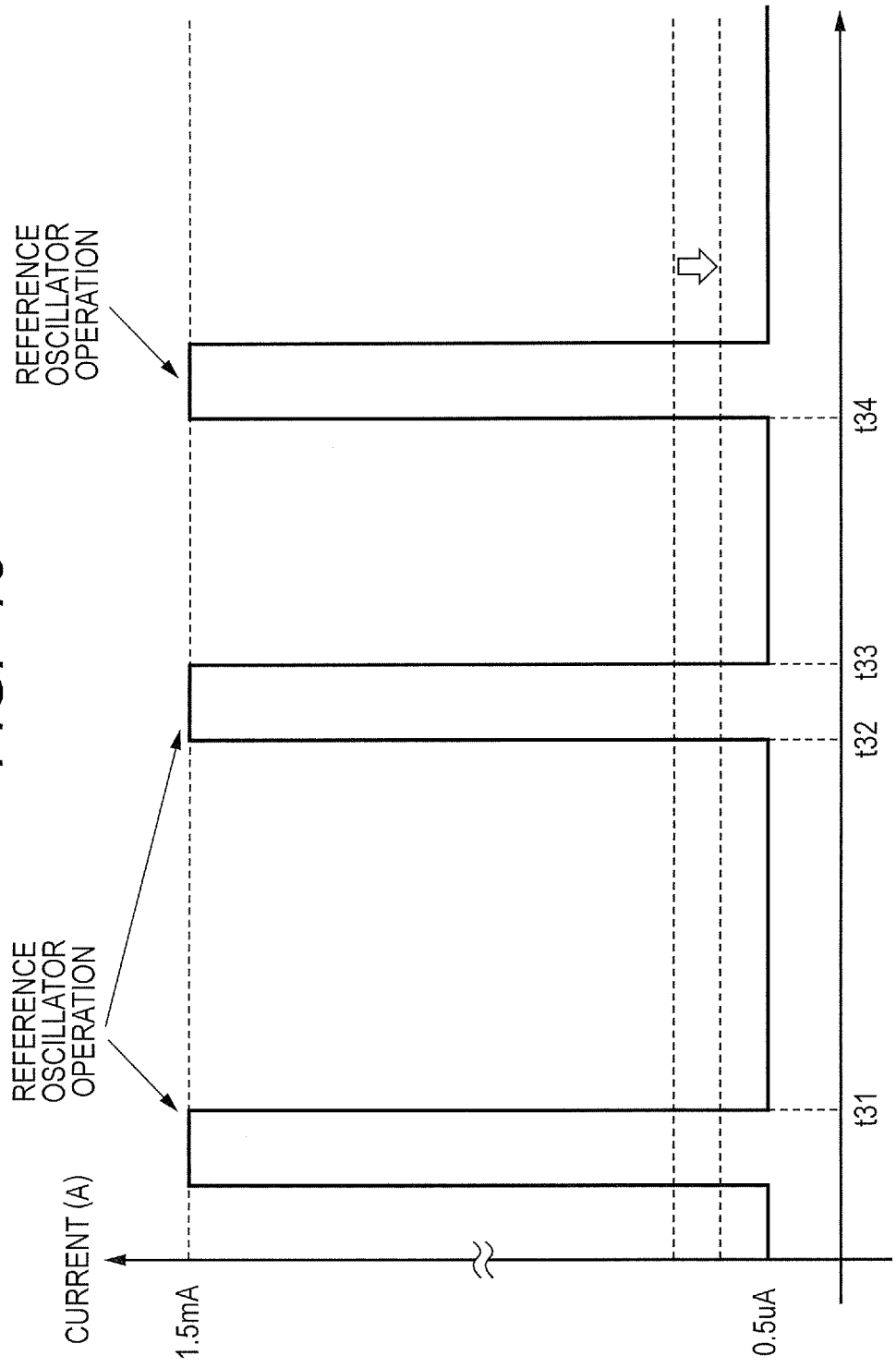
FIG. 16 is a drawing showing the total current consumption transition in the MUC10 and the reference oscillator of the first embodiment.

The effect rendered by the MCU10 (semiconductor device) of the present embodiment is described next while referring to FIG. 16. FIG. 16 is a concept view showing the total consumption current transition of the reference oscillator 220 and the MCU10 of the present embodiment. The ON/OFF control circuit 160 as described above generates an ON-OFF control signal (h) based on the frequency error of the basic clock (a) calculated by the frequency error calculator circuit 150 and the expectation value information retained in the expectation value storage circuit 1601. The ON-OFF control circuit 160 in other words varies the timing that the ON-OFF control signal (h) transitions to high level (value setting the operating status of frequency error calculator circuit 150 and reference oscillator 220) according to the size of the frequency error of basic clock (a).

In FIG. 16, the time from the timing t31 to t32, and the time from the timing t33 to t34 are different. As shown in FIG. 16, current consumption to an extent of 1.5 mA occurs when the frequency error calculator circuit 150 and the reference oscillator 220 operate. On the other hand, when the frequency error calculator circuit 150 and the reference oscillator 220 are not operated, current consumption only occurs to an extent of 0.5 μA. The MCU10 of the present embodiment lengthens the time that the frequency error calculator circuit 150 and the reference oscillator 220 operate when the frequency error is large. The current consumption of the overall device can in this way be reduced. The MCU10 moreover shortens the time that the frequency error calculator circuit 150 and the reference oscillator 220 operate when the frequency error is small. In this way, the count value (j) supplied to the operation clock generator circuit 110 is frequently rewritten and a correction made by utilizing the value of the frequency error that follows up (slaved to) the temperature fluctuation. The accuracy of the operation clock (f) generated by the operation clock generator circuit 110 can in this way be improved. The MCU10 of the present embodiment can in other words generate a high-precision correction clock (f) at the minimum required current consumption.

The contents and problem points of the clock device of Japanese Unexamined Patent Application Publication No. 2009-222486 are again described. Within this clock device, the differential (hereafter described as the first differential) between the 1PPS signal output from a GPS receiver, and a 1PPS signal output from a real-time clock based on the output from a voltage-controlled crystal oscillator is calculated based on the clock signal output from the voltage-controlled crystal oscillator that is the object for correction. The differential (called "second differential" for purposes of simplicity) between this first differential and the previous calculated first differential are next calculated in this time device. This time device next sets the subsequent operating interval of the GPS receiver according to the size of the second differential and corrects the voltage-controlled crystal oscillator. However, the first differential is output by utilizing the clock signal output from the voltage-controlled crystal oscillator to be corrected so the first differential might contain an error. Since error correction is performed by utilizing this first differential, the correction precision is not sufficient for performing error correction. Moreover, the second differential is calculated from the first differential that might possibly contain an error. There is therefore a high probability that the second differential is also an incorrect value so the correction interval is also incorrect.

Second Embodiment

A feature of the MCU10 of the present embodiment is that the interval the ON-OFF control signal (h) is set to high level is controlled based on the differential between the frequency error of the basic clock (a) and the currently calculated frequency error of the basic clock (a). The points where the MCU10 of the present embodiment differs from the MCU10 of the first embodiment is described next.

Figure 17:
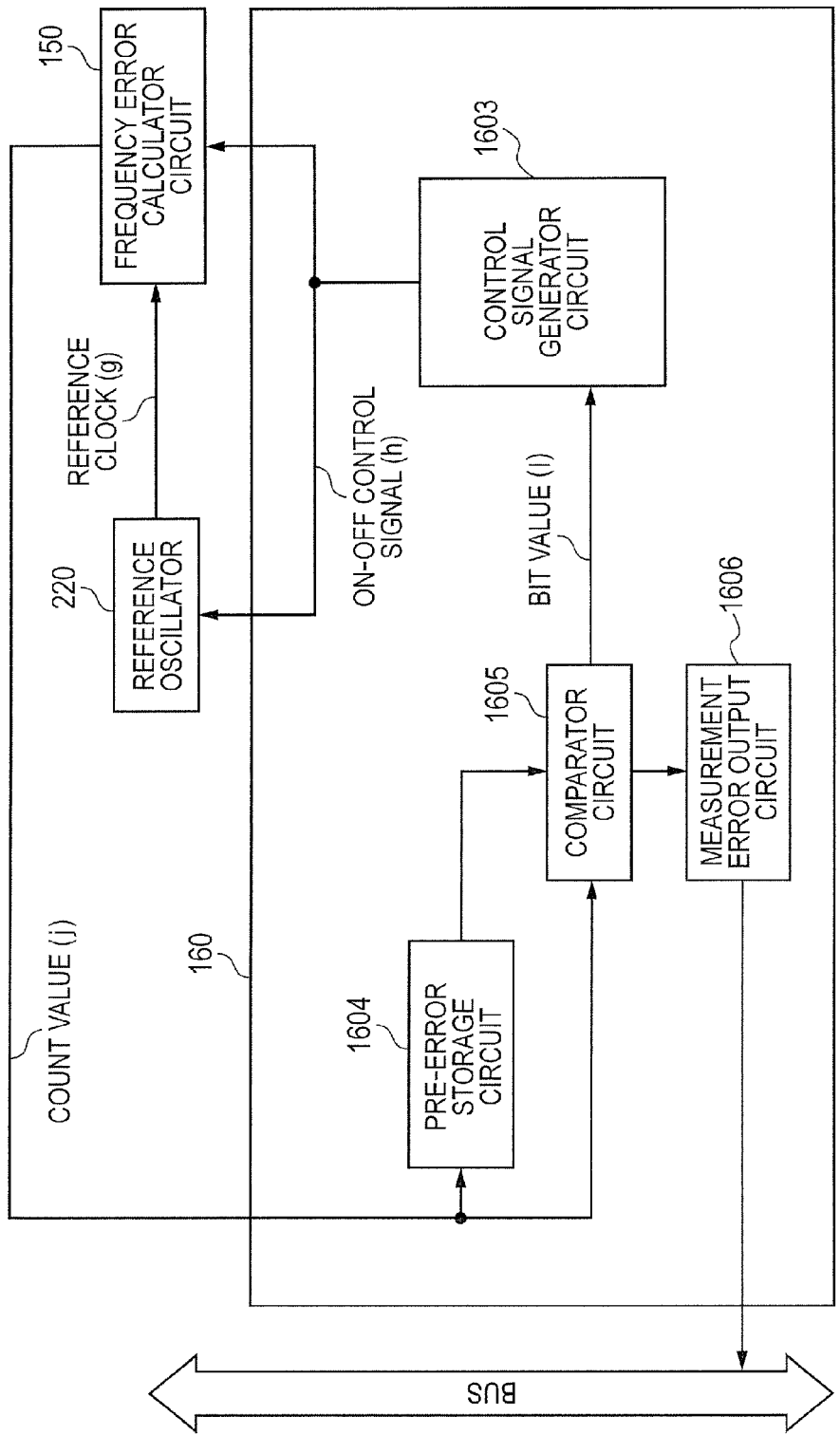
FIG. 17 is a block diagram showing the structure of the ON-OFF control circuit of the second embodiment.

FIG. 17 is a block diagram showing the structure of the ON/OFF control circuit 160 of the present embodiment. The ON/OFF control circuit 160 contains a pre-error storage circuit 1604, a comparator circuit 1605 (second comparator circuit), a measurement error output circuit 1606, and a control signal generator circuit 1603.

The pre-error storage circuit 1604 is a circuit for storing the count value (j) utilized in prior comparison. The pre-error storage circuit 1604 renews the value retained after comparison processing by the comparator circuit 1605. The comparator circuit 1605 compares the count value (j) input from the frequency error calculator circuit 150 with the values loaded (read out) from the pre-error storage circuit 1604. The comparator circuit 1605 in other words compares the prior frequency error measurement value of basic clock (a) with the current frequency error measurement value of basic clock (a).

The control signal generator circuit 1603 adjusts the timing that the ON-OFF control signal (h) is set to high level (or namely to ON), according to the bit value (l). FIG. 18 is a drawing showing an example of the interval where the ON-OFF control signal (h) is set to a high level and the bit value (l) output from the comparison processing by the comparison circuit 1605. As shown in the figure, the comparator circuit 1605 outputs a bit value (l) according to the difference between the prior frequency error (prior measured count value (j)) and the current frequency error (current measured count value (j)). The control signal generator circuit 1603 generates an ON-OFF control signal (h) that transitions to high level at the interval according to the bit value (l).

The description now returns again to FIG. 17. The comparator circuit 1605 outputs the difference between the count value (j) and the value stored in the pre-error storage circuit 1604 to the measurement error output circuit 1606. The measurement error output circuit 1606 outputs the error signal to an optional control circuit outside the MCU10 when the differential value that was input is higher than a specified value or in other words, when there is a large change in the frequency error. The control circuit that received this error signal performs display processing of the error message to the LCD panel 40.

The effect rendered by the MCU10 of the present embodiment is described next. The smaller the differential between the frequency error (hereafter also called prior error) of the prior measured basic clock (a) and the frequency error of the currently measured basic clock (a), the more the ON-OFF control circuit 160 increases the interval until the ON-OFF control signal (h) reaches high level. As clearly shown in FIG. 13, if there is no change in the frequency error then the MCU10 regards this as a state where there are no environmental temperature fluctuations. If no environmental fluctuations occur, then there is no major cause for changes in frequency error so no problems will occur even if the interval for measuring the frequency error is lengthened. Therefore implementing the control of the ON-OFF control signal (h) as described above can reduce the (electrical) current consumption by lowering the operating ratio of the reference oscillator 220 and the frequency error calculator circuit 150 and moreover no problem with the correction precision occurs.

Fluctuations in the environmental temperature are generally mild and even assuming a temperature change of 20 degrees in one day, the average temperature fluctuation per minute will be 0.03 degrees, so that the above described control can render the expected effects.

Even assuming that a fluctuation in frequency error occurs that is larger than expected, the above described measurement error output circuit 1606 will output an error signal to an optional control circuit. By utilizing this error signal to make notifications, the user can be made aware of frequency errors or abnormalities and can implement an optional countermeasure to deal with the errors or abnormalities.

The clock correction circuit 100 functions as the so-called RTC and so retains information (year, month, day, and season). The ON-OFF control circuit 160 can therefore generate an ON-OFF control signal (h) that also takes the time information into account. In the summer for example one can assume the temperature at noon will be higher than the normal temperature. In this case, the ON-OFF control circuit 160 can generate an ON-OFF control signal (h) that takes both the normal temperature and temperature shifts into account, in addition to the comparison results from the comparator circuit Third Embodiment A feature of the present embodiment is that the MCU10 can implement control so that the ON-OFF control signal (h) does not shift to high level due to user input. The points where the MCU10 of the present embodiment differs from the MCU10 of the first embodiment are described next.

Figure 19:
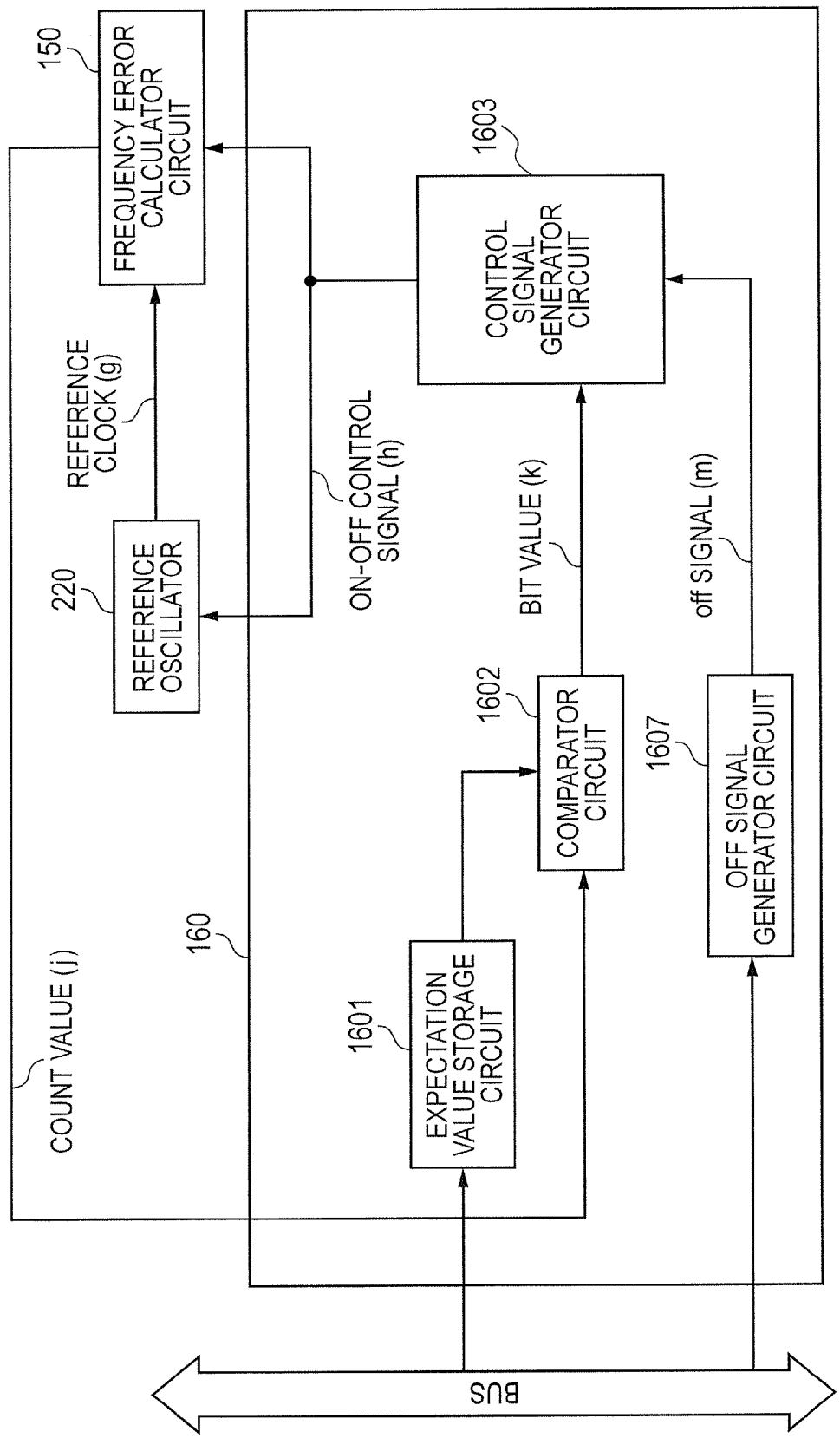
FIG. 19 is a block diagram showing the structure of the ON-OFF control circuit of the third embodiment.

FIG. 19 is a block diagram showing the structure of the ON/OFF control circuit 160 of the present embodiment. The ON-OFF control circuit 160 includes an OFF signal generator circuit 1607 in addition to the structure in FIG. 10.

Software written by the user (for example, software written according to input such as from buttons mounted on the outer surface of the electric power meter device 1) is input to the OFF signal generator circuit 1607. The OFF signal generator circuit 1607 outputs an OFF signal (m) to the control signal generator circuit 1603 when a value instructing OFF was written. Here, the OFF signal (m) is a signal for a command to prohibit transition of the ON-OFF control signal (h) to high level without the bit value (k).

When an OFF signal (m) is input, the control signal generator circuit 1603 fixes the ON-OFF control signal (h) at low level, and outputs that low level ON-OFF control signal. Namely, the control signal generator circuit 1603 implements control so that the frequency error calculator circuit 150 and the reference oscillator 220 do not operate. If the OFF signal (m) has not been input then the control signal generator circuit 1603 controls the ON-OFF control signal (h) according to the bit value (k) the same as in the first embodiment.

The effect rendered by the MCU10 of the present embodiment is described next. The electric power meter device sometimes includes a temperature sensor. The temperature sensor need not be a high-precision item and a generally utilized low-precision temperature sensor is sufficient. The MCU10 in this case can obtain the environmental temperature measured by the temperature sensor. If the environmental temperature is in the vicinity of the normal temperature (vicinity of 25 degrees) then the frequency error due to temperature drift is small (FIG. 13). In this case, there is no need for measuring the frequency error.

The ON/OFF control circuit 160 of the present embodiment contains an OFF signal generator circuit 1607 and is capable of fixing the ON-OFF control signal (h) at low level according to the user input. In other words, the present embodiment can implement control so that the frequency error due to input by the user is not calculated. In this way, when the electric power meter device 1 includes a temperature sensor, an even further reduction in electrical power consumption can be achieved compared to the first and second embodiments.

Fourth Embodiment

A feature of the present embodiment is that the MCU10 can set the interval in which the ON-OFF control signal (h) transitions to high level due to user input to the shortest interval. The point where the MCU10 of the present embodiment differs from the MCU10 of the first embodiment is described. The MCU10 of the present embodiment has no electric power meter device 1 but is mounted in an electronic device to operate a heater (or cooler) such as a rice cooker or microwave oven, etc.

Figure 20:
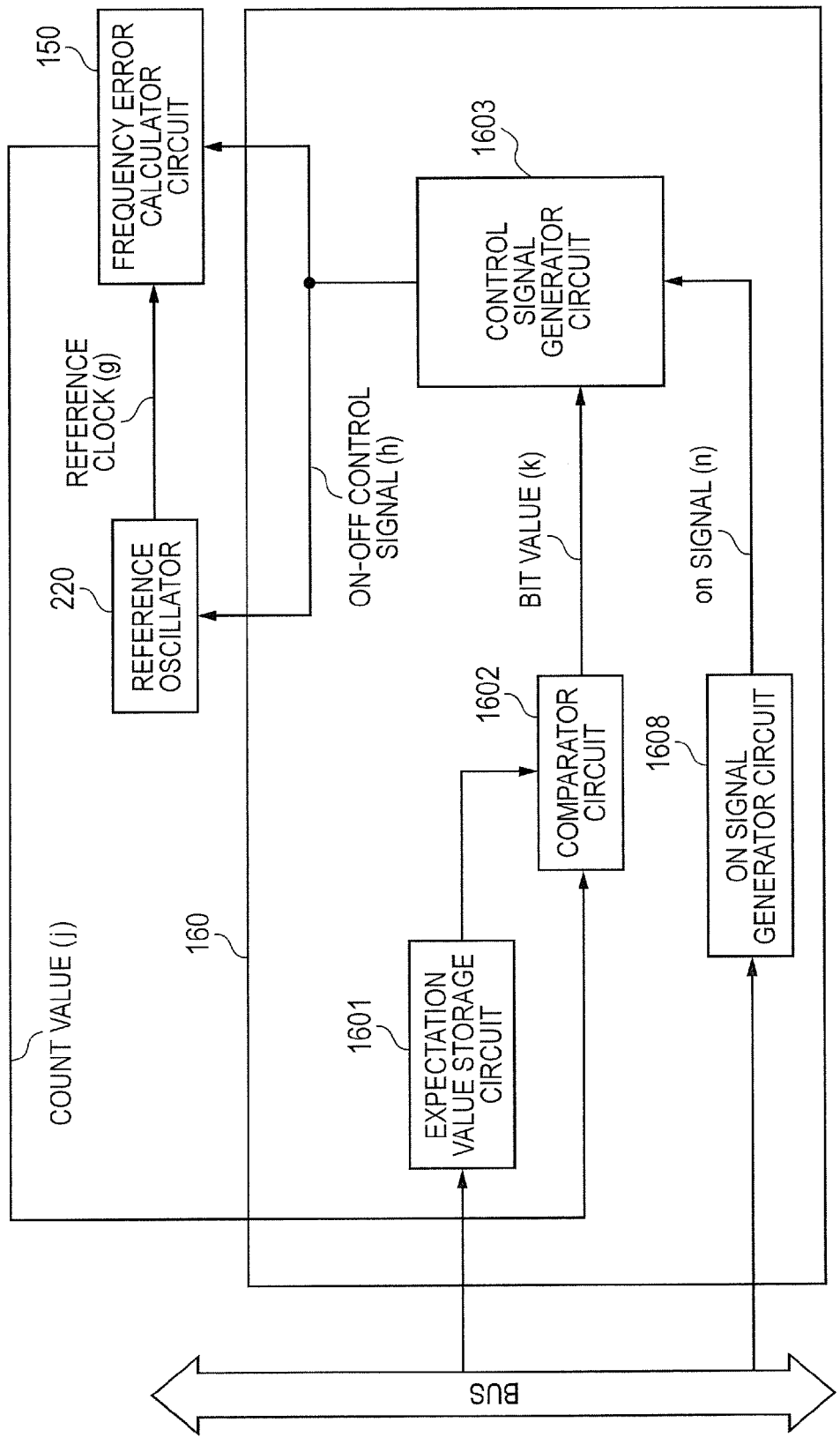
FIG. 20 is a block diagram showing the structure of the ON-OFF control circuit of the fourth embodiment.

FIG. 20 is a block diagram showing the structure of the ON-OFF control circuit 160 of the present embodiment. The ON-OFF control circuit 160 includes an ON signal generator circuit 1608 in addition to the structure in FIG. 10.

An operation control circuit not shown in the drawing, inputs a control signal to the ON signal generator circuit 1608. The operation control signal is a signal that reports the start of the heating (or cooling) function. When this control signal is input, the ON signal generator circuit 1608 outputs an ON signal (n) to the control signal generator circuit 1603. The ON signal (n) is a signal commanding that the interval for setting the ON-OFF control signal (h) transition to high level to the shortest interval.

The control signal generator circuit 1603 sets the ON-OFF control signal (h) transition to high level to the shortest interval when an ON signal (n) is input. The user can set this shortest value in a register not shown in the figure. If no ON signal (n) is input, the control signal generator circuit 1603 controls the ON-OFF control signal (h) according to the bit value (k) the same as in the first embodiment.

The effect rendered by the MCU10 of the present embodiment is described next. The MCU10 can be incorporated into an electronic device for heating operation such as a rice cooker or microwave oven, etc. In this case, the heating causes the temperature within the device to greatly change. In the MCU10 of the present embodiment, the ON signal generator circuit 1608 generates ON signal (n) according to controls signal from an external unit. The control signal generator circuit 1603 that was input by the ON signal (n) sets the shorted interval for the ON/OFF control signal (h) to transition to high level. Here, the control signal is assumed to be input when for example the start button for the heating operation is pressed. In this way, the shortest calculated interval for the frequency error in basic clock (a) can be set during heating, and the sudden changes in the frequency error that accompany temperature fluctuations can also be handled. In other words, the present embodiment renders the effect of improving precision in the correction clock (f) generated by the MCU10, even when a sudden temperature fluctuation occurs in the environment.

The control signal provides control so that input is terminated when the heating process is finished. In this way, the interval calculated for the frequency error can be implemented after completion of the heating process the same as in the first embodiment and the current consumption can be suppressed to the minimum level.

Fifth Embodiment

A feature of the present embodiment is that the MCU10 can adjust the transition interval of the ON-OFF control signal (h). The point where the MCU10 of the present embodiment differs from the MCU10 of the first embodiment is described next.

Figure 21:
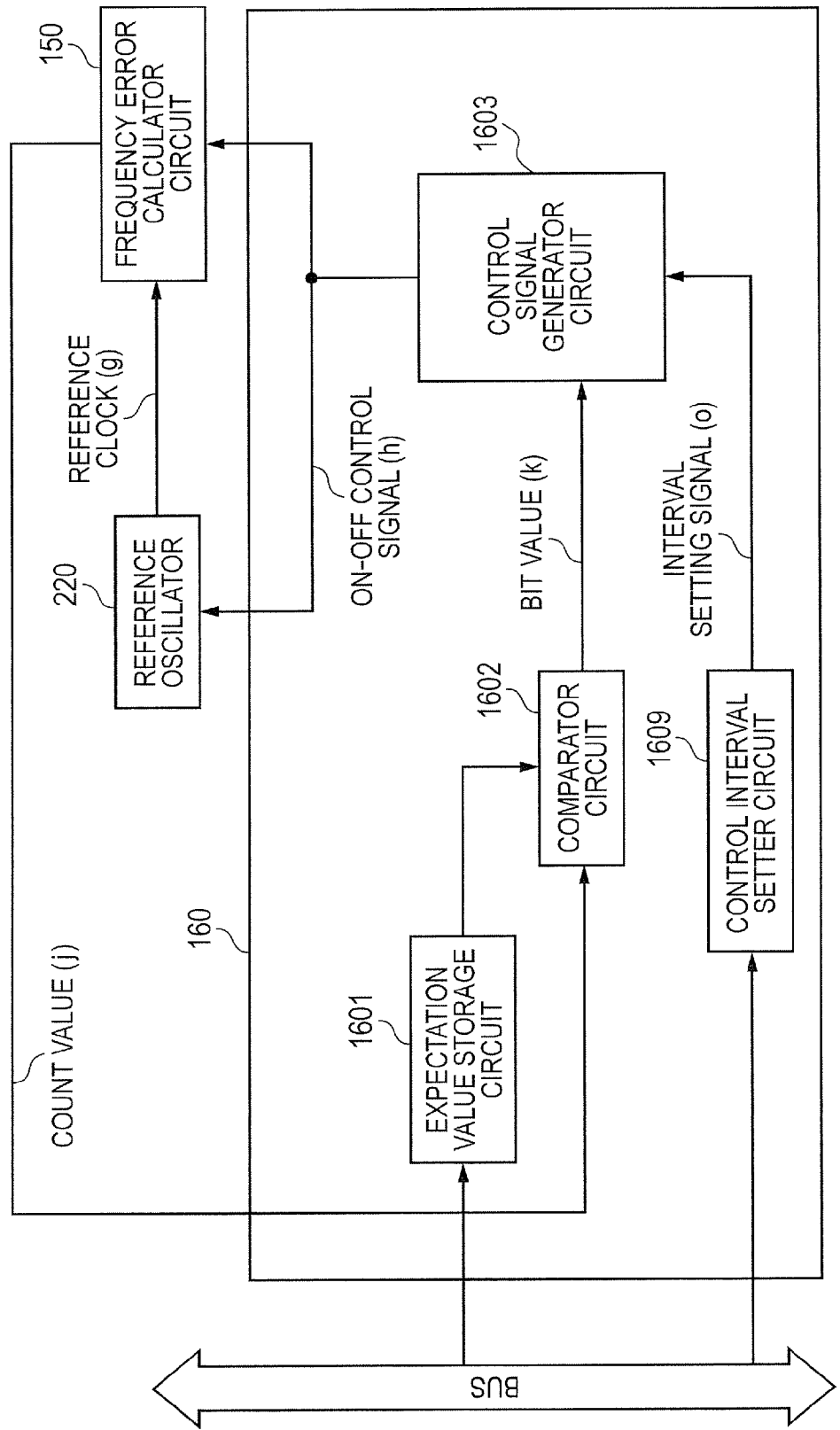
FIG. 21 is a block diagram showing the structure of the ON-OFF control circuit of the fifth embodiment.

FIG. 21 is a block diagram showing the structure of the ON-OFF control circuit 160 of the present embodiment. The ON-OFF control circuit 160 contains a control interval setter circuit 1609 in addition to the structure in FIG. 10.

The ON-OFF signal (h) setting information is input to the control interval setter circuit 1609. The setting information is information that the user inputs from an optional interface coupled to the electric power meter device 1, and is information showing the ON-OFF interval corresponding to the bit value (k). The control interval setter circuit 1609 inputs an interval setter signal (o) to the control signal generator circuit 1603 according to the setting information.

The interval setter signal (o) is a signal for setting an ON-OFF interval corresponding to the bit value (k) and is a signal that changes the time of the ON-OFF interval corresponding to the bit value (k) shown in FIG. 12. In FIG. 12 for example, the ON-OFF interval is 20 seconds for the case where the bit value (k) is "000" but the ON-OFF interval can be set to 10 seconds or to 30 seconds by the interval setter signal (o).

Next, the effect rendered by the MCU10 of the present embodiment is described. A feature of the present embodiment is that the ON/OFF control signal (h) interval can be adjusted by the user as described above. The user of the MCU10 can in this way change the operation ratio of the frequency error calculator circuit 150 and the reference oscillator 220 according to the application of the correction clock (f). If the user for example requests a reduction in power consumption rather than higher precision, then the ON-OFF interval can be set to a longer interval. On the other hand, if the user needs higher precision from the correction clock (f), then the ON-OFF interval can be set to shorter interval. The lower power consumption and correction clock precision (f) required by the user can in this way be achieved.

Sixth Embodiment

The MCU10 of the present embodiment is an optional combination of the first through the fifth embodiments. An example of the MCU10 of the present embodiment is described next.

Figure 22:
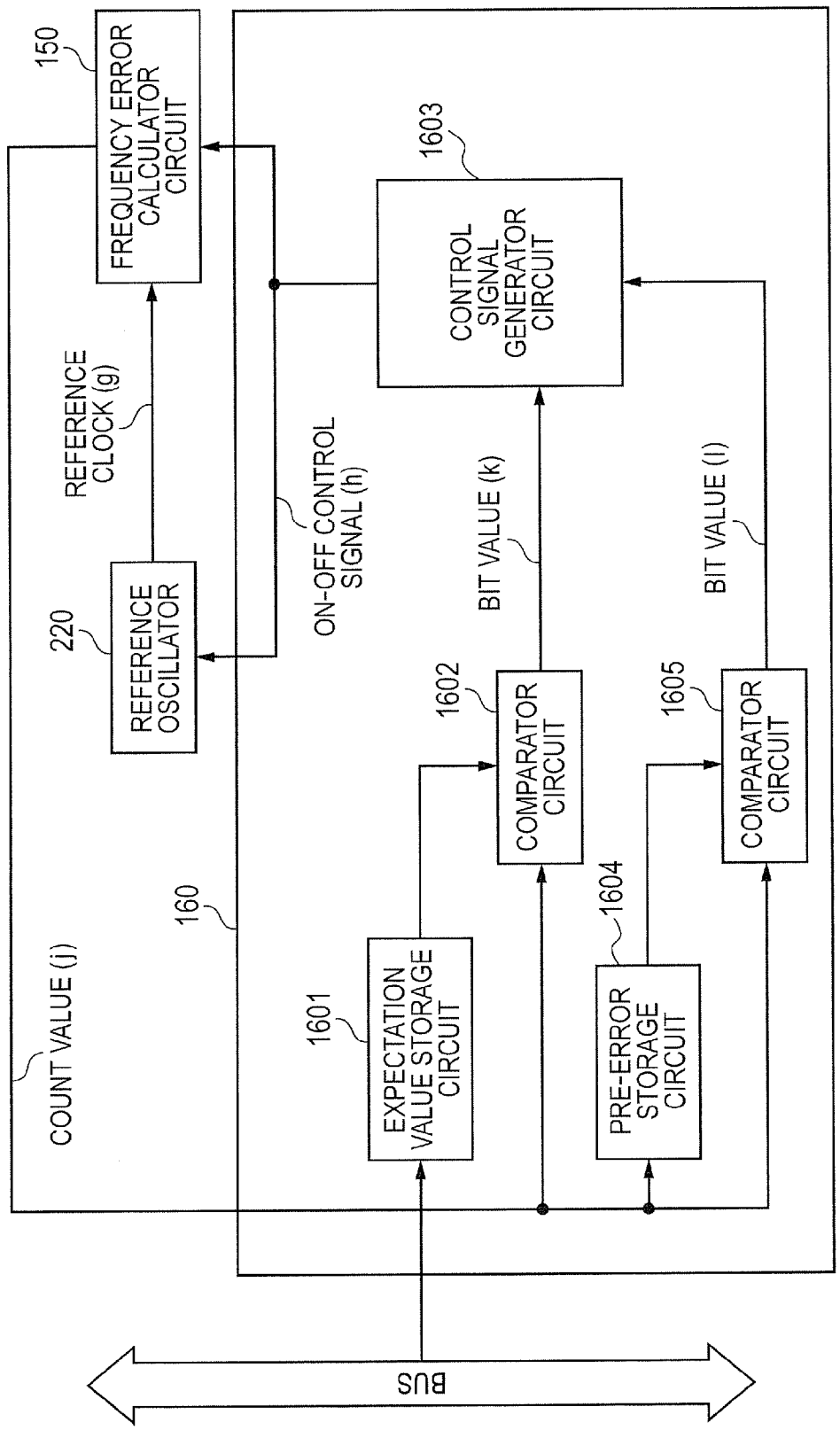
FIG. 22 is a block diagram showing the structure of the ON-OFF control circuit of the sixth embodiment.

FIG. 22 is a block diagram showing the structure of the ON/OFF control circuit 160 of the present embodiment. The ON-OFF control circuit 160 has a structure including the structure of the first embodiment and the structure of the second embodiment. The measurement error output circuit 1606 not shown in the drawing may include the ON-OFF control circuit 160.

FIG. 23 is a table showing the data retained by the expectation value storage circuit 1601 of the present embodiment. FIG. 24 is a table showing data specifying the relation between the count value (j) and values utilized by the comparator circuit 1605 that are stored by the pre-error storage circuit 1604.

The comparator circuit 1602 compares the expectation value information retained in the pre-error storage circuit 1604 with the count value (j) the same as in the first embodiment, and outputs the bit value (k) to the control signal generator circuit 1603. The comparator circuit 1605 compares the prior count value (j) with the current count value (j) and outputs the comparison result to the control signal generator circuit 1603 as a bit value (l)

The control signal generator circuit 1603 generates an ON-OFF control signal (h) based on the bit value (k) and the bit value (l). More specifically, the control signal generator circuit 1603 adjusts the timing in which the ON-OFF control signal (h) transitions to high level (namely ON) according to the bit value (k) and the bit value (l). The control signal generator circuit 1603 internally retains data such as shown for example in FIG. 25 and controls the timing that the ON-OFF control signal (h) transitions to high level according to the bit value (k) and the bit value (l). For purposes of convenience in the description, besides the bit value (k), the bit value (l), and the ON-OFF interval, the assumed temperature, the values stored by the pre-error storage circuit, and the presence or absence of a temperature fluctuation are recorded in the FIG. 25.

As shown in the figure, when the count value (j) is 20000000 (on in other words, when the bit value (k) is 000), the temperature inside the device is assumed to be in the vicinity of the normal temperature. So if there is no difference in the current count value (j) and the count value stored in the pre-error storage circuit 1604 or the difference is not large, then there is no problem even if the interval for transitioning the ON-OFF control signal (h) to high level has become large. If for example, the bit value (k) is 000, and the bit value (l) is 000, the control signal generator circuit 1603 sets the interval for transitioning the ON-OFF control signal (h) to high level, to a comparatively long period of 20 seconds. If the difference between the count value and the prior count value is large (e.g. bit value (l) is 010) even if in the vicinity of normal temperature (bit value (k) is 000), the control signal generator circuit 1603 sets the interval for transitioning the ON-OFF control signal (h) to high level to a comparatively short period of 1 second.

However when the count value (j) is 20001000 (or in other words, the bit value (k) is 110), the temperature within the device is assumed as a temperature far away from the normal temperature (for example the vicinity of −12 degrees or vicinity of 62 degrees). In this case the fluctuation in frequency error will be extremely large (FIG. 13) even if only a small temperature fluctuation occurs. The control signal generator circuit 1603 therefore sets the interval for transitioning the ON-OFF control signal (h) to high level to a short time period of 2 seconds even if there is no difference between the current count value (j) and the count value stored in the pre-error storage circuit or the difference is not large.

The effect rendered by the MCU10 of the present embodiment is described next. The above described ON-OFF control circuit 160 has a structure including the structure of the first embodiment and the structure of the second embodiment. In this way, an ON-OFF control signal (h) that covers both the measured frequency error and the prior error can be generated. Precise control can in this way be implemented by the ON-OFF control signal (h) according to the transition of the count value (j) and the temperature fluctuation within the device. Correction control can therefore be performed with good precision and the power consumption can be reduced.

The ON-OFF control circuit 160 in the above example is not necessarily limited to a structure that jointly includes the structure of the first embodiment and structure of the second embodiment. The ON-OFF control circuit 160 may for example include the ON signal generator circuit 1607, the OFF signal generator circuit 1608, and the control interval setter circuit 1609 along with the structure in FIG. 22.

Other Embodiments

In the above description, the MCU10 was described as having a structure including the frequency error calculator circuit 150 however the invention is not necessarily always limited to this structure. The frequency error in basic clock (a) can also be estimated by utilizing temperature sensors inside and outside the MCU10.

Figure 26:
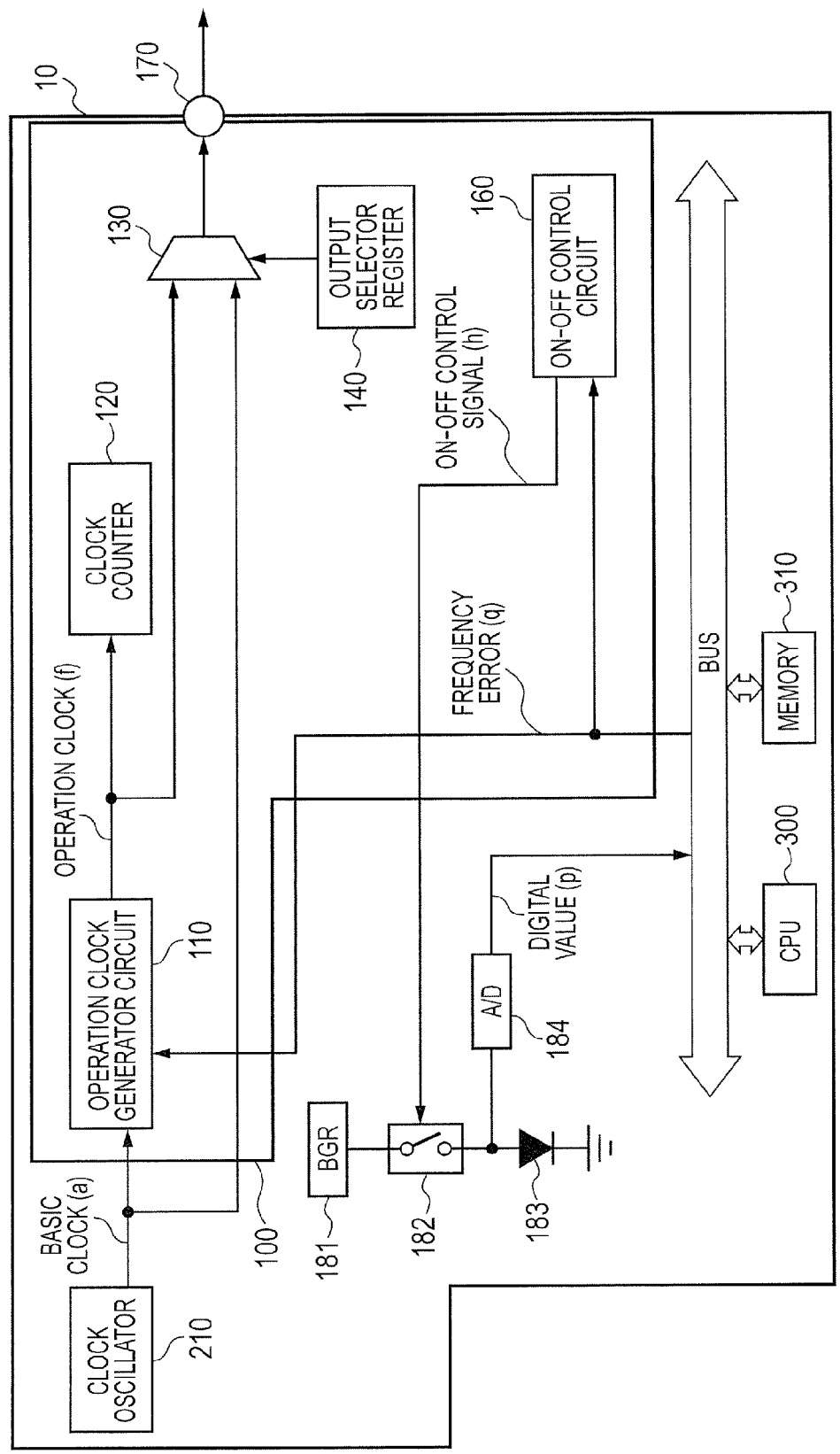
FIG. 26 is a block diagram showing the structure of MCU (semiconductor device) of another embodiment.

FIG. 26 is a block diagram showing a structure utilizing a temperature sensor within the MCU10. The MCU10 includes an analog switch 182, a temperature sensor 183, an A/D converter 184, and a BGR (Band Gap Reference) 181 instead of the frequency error calculator circuit 150.

The BGR181 generates a reference voltage and supplies a reference voltage by way of the analog switch 182 to the temperature sensor 183. The temperature sensor 183 measures the temperature within the MCU10. The A/D converter 184 converts the temperature information measured by the temperature sensor 183 from an analog value to a digital value (p).

The memory 310 stores a temperature table storing the relation between the temperature and frequency error. The CPU300 calculates the frequency error (q) based on the temperature table within the memory 310 and the digital value (p) output from the A/D converter 184. The CPU300 inputs the calculated frequency error (q) into the operation clock generator circuit 110 and the ON-OFF control circuit 160. The ON/OFF control circuit 160 generates an ON-OFF control signal (h) the same as in the first embodiment according to the frequency error (q) that was input and supplies the ON/OFF control signal (h) to the analog switch 182. The analog switch 182 sets to a closed state when the ON-OFF control signal (h) is high level and sets to an open state when the ON-OFF control signal (h) is low level.

Figure 27:
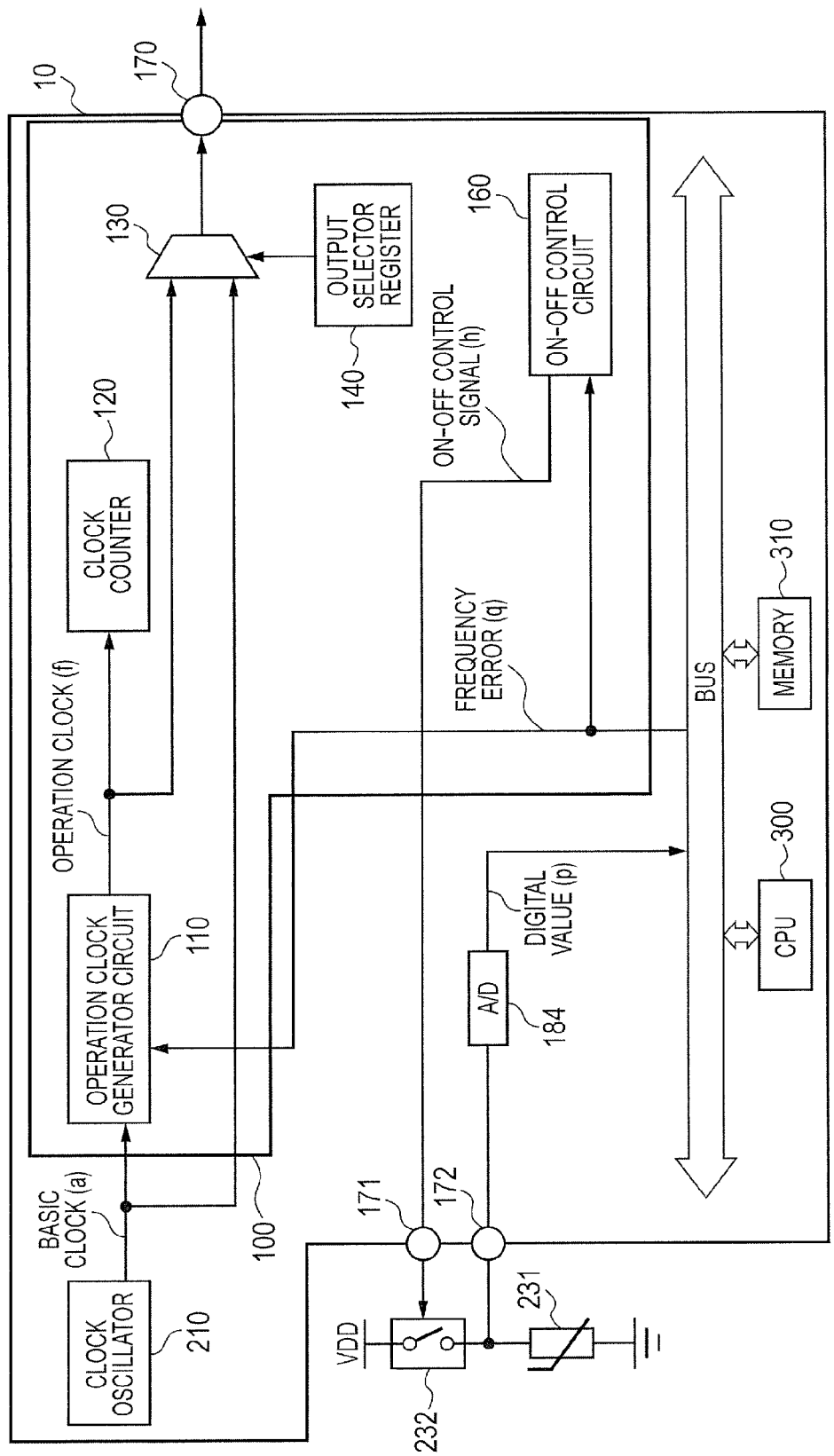
FIG. 27 is a block diagram showing the structure of MCU (semiconductor device) of another embodiment.

FIG. 27 is a block diagram showing a structure utilizing a temperature sensor (thermistor) outside the MCU10. The electric power meter device 1 includes a thermistor 231 and an analog switch 232 outside the MCU10. The MCU10 includes an A/D converter 184.

A power supply voltage VDD is supplied to the thermistor 231 by way of the analog switch 232. The thermistor 231 performs temperature measurement of the inside of the device. The temperature information which is measured analog values is input by way of an external terminal 172 of MCU10 into the A/D converter 184. The A/D converter 184 converts the temperature information from analog values to digital values (p). The processing by the CPU300 and the structure of the memory 310 is the same as in FIG. 26. The ON/OFF control circuit 160 generates the ON-OFF control signal (h) the same as in the first embodiment according to the frequency error (q) that was input, and supplies the ON-OFF control signal (h) to the analog switch 232 by way of the external terminal 171. The analog switch 232 sets to a closed state when the ON-OFF control signal (h) is high level, and sets to an open state when the ON-OFF control signal (h) is low level.

Figure 28:
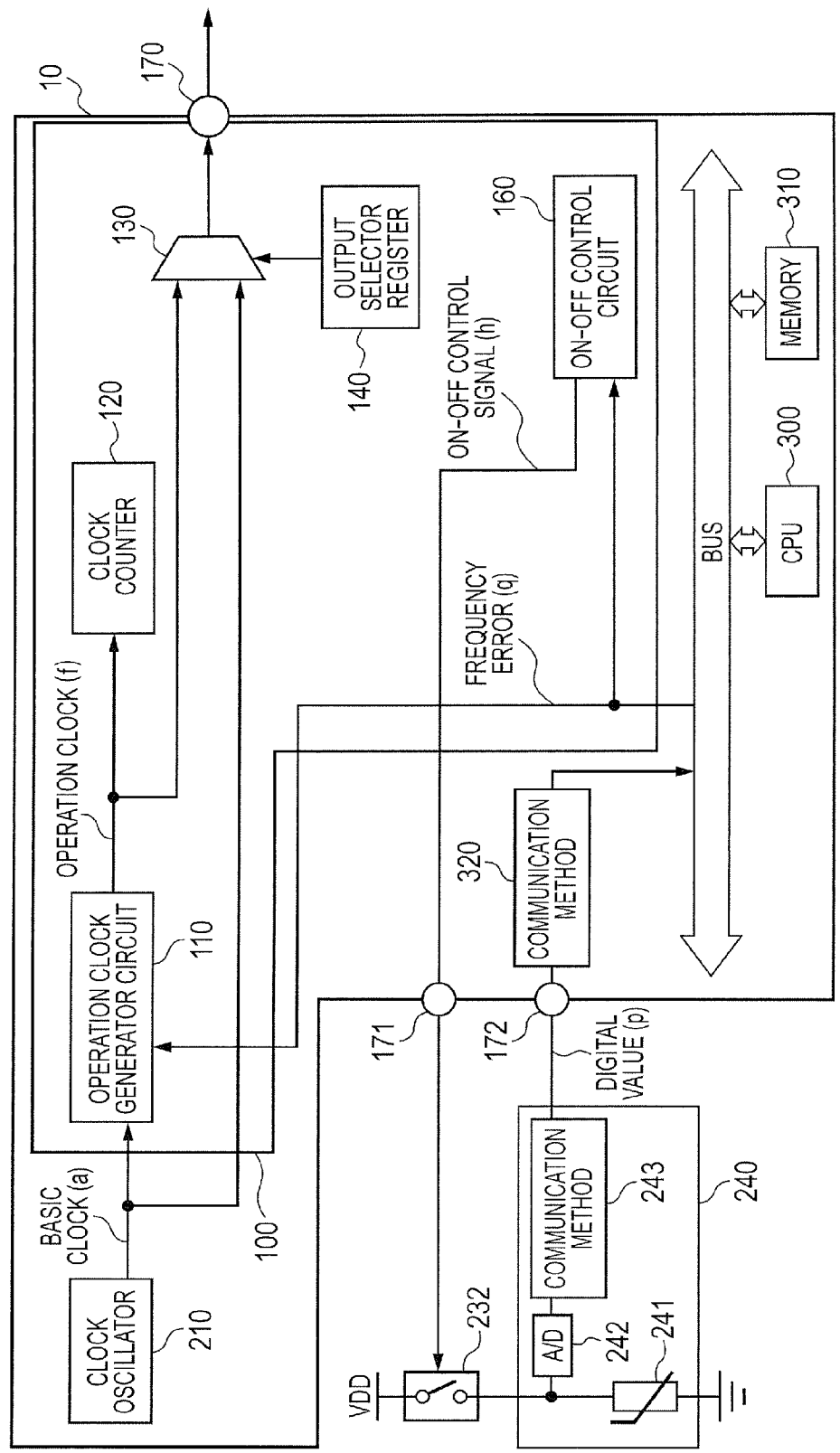
FIG. 28 is a block diagram showing the structure of MCU (semiconductor device) of another embodiment.

FIG. 28 is a block diagram showing a structure utilizing a temperature IC outside the MCU10. The structure in FIG. 28 is extremely similar to the structure in FIG. 27. The electric power meter device 1 contains a digital temperature sensor IC240 and an analog switch 232 outside the MCU10. The digital temperature sensor IC240 contains a temperature sensor 241, and A/D converter 242, and a communication method 243. The MCU10 contains a communication method 320 in addition to the above structure. The A/D converter 242 converts the temperature information inside the device measured by the temperature sensor 241 from analog values to digital value (p). The communication method 243 sends the digital value (p) in serial format to the MCU10. The communication method 320 receives the digital value (p) sent in serial format. This digital value (p) is utilized in the calculation of the frequency error (q) in the CPU300. The processing by the CPU300 and the structure of the memory 310 is the same as in FIG. 26. The ON-OFF control circuit 160 generates an ON-OFF control signal (h) the same as in the first embodiment according to the frequency error (q) that was input, and supplies the ON-OFF control signal (h) by way of the external terminal 171 to the analog switch 232.

Along with being able to calculate the frequency error even via the structures in FIG. 26 through FIG. 28, the ON-OFF control circuit 160 controls the operation of the processing units for calculating the frequency error by way of the analog switches. Reduced current consumption can in this way be achieved by suppressing the current consumption to a minimum.

The present invention was specifically described based on the embodiments of the invention rendered by the present inventors. However, the present invention is not limited by the above embodiments and may include all manner of variations and adaptations not departing from the spirit and scope of the present invention. In the above described invention for example, utilization of the MCU10 in an electrical power meter device or heating device was assumed. However, the present invention is not necessarily always limited to these devices and may also of course be utilized in household appliances other than communication devices or heating devices.

Amongst others, a portion of the contents described in the embodiment are described as follows.

(1) The semiconductor device includes a correction clock generator circuit to output a correction clock whose frequency error was corrected based on the first clock and the frequency error of the first clock; and a control circuit to generate an ON-OFF control signal to specify the calculation timing for calculating the frequency error of the first clock based on the frequency error difference of the first clock.

(2) The semiconductor device in (1) the frequency error of the first clock is calculated based on temperature information sensed by a temperature sensor.

What is claimed is:

1. A semiconductor device comprising:
a frequency error calculator circuit that calculates a frequency error of a first clock based on a first clock and a second clock having a higher frequency than the first clock;
a correction clock generator circuit that outputs a correction clock having a corrected frequency determined by the first clock and the frequency error calculated by the frequency error calculator circuit; and
a control circuit that generates an ON-OFF control signal based on the frequency error calculated by the frequency error calculator circuit,
wherein the frequency error calculator circuit calculates the frequency error at a calculation timing specified by the ON-OFF control signal.

2. The semiconductor device according to claim 1,
wherein the frequency error calculator circuit outputs a count value of the second clock within a specified period of the first clock, as the frequency error of the first clock, and
wherein the control circuit includes:
a storage circuit that stores expectation value information specifying a relation between a deviation size between the count value and an expectation value, and the calculation timing;
a first comparator circuit that compares the count value with the expectation value information; and
a control signal generator circuit that generates the ON-OFF control signal based on a comparison result of the first comparator circuit.

3. The semiconductor device according to claim 1,
wherein the frequency error calculator circuit outputs a count value of the second clock within a specified period of the first clock as the frequency error of the first clock, and
wherein the control circuit includes:
a pre-error storage circuit that stores a first count value output by the frequency error calculator circuit at a first calculation timing;
a second comparator circuit that compares the first count value stored in the pre-error storage circuit with a second count value output by the frequency error calculator circuit at a second calculation timing after the first calculation timing; and
a control signal generator circuit that generates the ON-OFF control signal based on a comparison result output from the second comparator circuit.

4. The semiconductor device according to claim 3,
wherein the control circuit further includes:
a measurement error output circuit that outputs an error signal when a difference between the first count value and the second count value is greater than a predetermined value.

5. The semiconductor device according to claim 1,
wherein, when a specified value is input from an external unit, the control circuit stops the operation of the frequency error calculator circuit regardless of the frequency error calculated by the frequency error calculator circuit.

6. The semiconductor device according to claim 1,
wherein, when a control signal is input from an external unit, the control circuit generates the ON-OFF control signal that sets a predetermined timing as the calculation timing regardless of the frequency error calculated by the frequency error calculator circuit.

7. The semiconductor device according to claim 2,
wherein the control circuit further includes:
a control interval setter circuit that generates an interval setter signal based on setting information indicating a relation between a deviation size between the count value and the expectation value and a time interval between ON states of the ON-OFF control signal, and
wherein the control signal generator circuit generates the ON-OFF control signal based on the comparison result of the first comparator circuit and the interval setter signal.

8. The semiconductor device according to claim 1,
wherein the control circuit supplies the ON-OFF control signal to a reference oscillator generating the second clock, and utilizes the ON-OFF control signal to control a timing for generating the second clock.

9. The semiconductor device according to claim 1,
wherein the control circuit generates the ON-OFF control signal so that the smaller the frequency error is, the more time the calculation timing is delayed, or so that the greater the frequency error is, the less time the calculation timing is delayed.

10. The semiconductor device according to claim 1,
wherein the frequency error calculator circuit outputs a count value of the second clock within a specified period of the first clock, as the frequency error of the first clock, and
wherein the control circuit includes:
a storage circuit that stores expectation value information specifying the relation between a deviation size between the count value and an expectation value, and the calculation timing;
a pre-error storage circuit that stores a first count value output by the frequency error calculator circuit at a first calculation timing;
a first comparator circuit that compares a second count value output by the frequency error calculator circuit at a second calculation timing after the first calculation timing with the expectation value information;

a second comparator circuit that compares the first count value stored in the pre-error storage circuit with the second count value output by the frequency error calculator circuit; and a control signal generator circuit that generates the ON-OFF control signal based on comparison results output from the first comparator circuit and output from the second comparator circuit.

11. The semiconductor device according to claim 1,
wherein the ON-OFF control signal is a binary signal that transitions to high level at the calculation timing, and in all other cases is at low level; and
wherein the frequency error calculator circuit includes:
a first logical AND circuit that receives the ON-OFF control signal and the first clock;
a second logical AND circuit that receives the ON-OFF control signal and the second clock;
a counter that counts, as the frequency error, transitions of an output signal of the second logical AND circuit within a period specified by an output signal of the first logical AND circuit or a frequency dividing signal of the output signal of the first logical AND circuit; and
a count control circuit that outputs an operation permit signal indicating permission to operate the counter when the ON-OFF control signal is high level.

12. The semiconductor device according to claim 3,
wherein the control signal generator circuit generates the ON-OFF control signal that takes into account time information along with the comparison result output from the second comparator circuit.

13. A heating device comprising the semiconductor device according to claim 6.

14. A power meter device comprising the semiconductor device according to claim 1.

15. The semiconductor device according to claim 1, wherein the control circuit includes:
a storage circuit that stores expectation value information specifying a relation between a deviation size between a count value and an expectation value, and the calculation timing;
a first comparator circuit that compares the count value with the expectation value information; and
a control signal generator circuit that generates the ON-OFF control signal based on a comparison result of the first comparator circuit.

16. The semiconductor device according to claim 1, wherein the control circuit varies the timing that the ON-OFF control signal transitions to high level according to a size of the frequency error.

17. The semiconductor device according to claim 1, wherein the control circuit varies the timing that the ON-OFF control signal transitions according to the frequency error.

18. A clock correction method comprising:
calculating a frequency error of a first clock at a calculation timing based on a first clock and a second clock having a higher frequency than the first clock;
generating a correction clock having a corrected frequency determined by the calculated frequency error; and
adjusting the calculation timing to calculate the frequency error of the first clock based on the first clock and the calculated frequency error.

19. The clock correction method according to claim 18, further comprising:
generating a control signal based on the calculated frequency error;
calculating the frequency error at a calculation timing specified by the control signal;
storing, in a storage circuit, expectation value information specifying a relation between a deviation size between the count value and an expectation value, and the calculation timing;
comparing the count value with the expectation value information; and
generating the control signal based on the comparing of the count value with the expectation value information.

20. A semiconductor device comprising:
a frequency error calculator that calculates a frequency error of a first clock based on a first clock and a second clock having a higher frequency than the first clock;
a correction clock generator that outputs a correction clock having a corrected frequency determined by the first clock and the frequency error calculated by the frequency error calculator; and
a controller that generates a control signal based on the frequency error calculated by the frequency error calculator,
wherein the frequency error calculator calculates the frequency error at a calculation timing specified by the control signal,
wherein the controller adjusts the calculation timing to calculate the frequency error of the first clock based on the first clock and the calculated frequency error, and
wherein the frequency error calculator outputs a count value of the second clock within a specified period of the first clock, as the frequency error of the first clock.

* * * * *